US009236495B2

(12) United States Patent
Seo et al.

(10) Patent No.: US 9,236,495 B2
(45) Date of Patent: Jan. 12, 2016

(54) OXIDE THIN FILM TRANSISTOR, METHOD FOR FABRICATING TFT, DISPLAY DEVICE HAVING TFT, AND METHOD FOR FABRICATING THE SAME

(71) Applicant: LG Display Co., Ltd., Seoul (KR)

(72) Inventors: HyunSik Seo, Gyeonggi-Do (KR); MoonGoo Kim, Gyeonggi-Do (KR); BongChul Kim, Daegu (KR); JeongHoon Lee, Gyeongsangbuk-Do (KR); Changll Ryoo, Gyeonggi-Do (KR)

(73) Assignee: LG Display Co., Ltd., Seoul (KR)

( * ) Notice: Subject to any disclaimer, the term of this patent is extended or adjusted under 35 U.S.C. 154(b) by 243 days.

(21) Appl. No.: 13/729,539

(22) Filed: Dec. 28, 2012

(65) Prior Publication Data

US 2013/0313530 A1    Nov. 28, 2013

(30) Foreign Application Priority Data

May 24, 2012    (KR) .................. 10-2012-0055658

(51) Int. Cl.
| | | |
|---|---|---|
| *H01L 29/786* | (2006.01) | |
| *H01L 29/66* | (2006.01) | |
| *H01L 29/423* | (2006.01) | |

(52) U.S. Cl.
CPC .... *H01L 29/78693* (2013.01); *H01L 29/42384* (2013.01); *H01L 29/66969* (2013.01); *H01L 29/7869* (2013.01); *H01L 29/78606* (2013.01)

(58) Field of Classification Search
CPC ............ H01L 27/14621; H01L 27/322; H01L 27/3223; H01L 29/7869; H01L 29/78693; G02F 1/133514
See application file for complete search history.

(56) References Cited

U.S. PATENT DOCUMENTS

| | | | | |
|---|---|---|---|---|
| 7,791,075 | B2 * | 9/2010 | Kobayashi et al. | ............. 257/59 |
| 2008/0026500 | A1 | 1/2008 | Jo et al. | |

FOREIGN PATENT DOCUMENTS

| | | |
|---|---|---|
| CN | 1897299 A | 1/2007 |
| CN | 101533857 A | 9/2009 |
| CN | 101625977 A | 1/2010 |
| CN | 101907807 A | 12/2010 |
| JP | 2006-313363 A | 11/2006 |

(Continued)

OTHER PUBLICATIONS

JP 2006-313363—English Translation.*

(Continued)

*Primary Examiner* — Jose R Diaz
(74) *Attorney, Agent, or Firm* — Fenwick & West LLP

(57) ABSTRACT

There are provided an oxide TFT, a method for fabricating a TFT, an array substrate for a display device having a TFT, and a method for fabricating the display device. The oxide thin film transistor includes: a gate electrode formed on a substrate; a gate insulating layer formed on the entire surface of the substrate including the gate electrode; an active layer pattern formed on the gate insulating layer above the gate electrode and completely overlapping the gate electrode; an etch stop layer pattern formed on the active layer pattern and the gate insulating layer; and a source electrode and a drain electrode formed on the gate insulating layer including the etch stop layer pattern and the active layer pattern and spaced apart from one another, and overlapping both sides of the etch stop layer pattern and the underlying active layer pattern.

10 Claims, 12 Drawing Sheets

(56) References Cited

FOREIGN PATENT DOCUMENTS

| | | | |
|---|---|---|---|
| JP | 2006313363 A | * | 11/2006 |
| KR | 10-2001-0003441 A | | 1/2001 |
| KR | 10-2008-0009794 A | | 1/2008 |
| KR | 10-2011-0033648 A | | 3/2011 |
| KR | 10-2011-0084523 A | | 7/2011 |

OTHER PUBLICATIONS

Taiwan Intellectual Property Office, Office Action, Taiwan Patent Application No. 101149202, Feb. 13, 2015, nine pages.
State Intellectual Property Office of the People's Republic of China, First Office Action, Chinese Patent Application No. 201210585093.X, Jul. 14, 2015, twenty-seven pages.

* cited by examiner

000# OXIDE THIN FILM TRANSISTOR, METHOD FOR FABRICATING TFT, DISPLAY DEVICE HAVING TFT, AND METHOD FOR FABRICATING THE SAME

The present disclosure relates to subject matter contained in priority Korean Application No. 10-2012-0055658, filed on May 24, 2012, which is herein expressly incorporated by reference in its entirety.

FIELD OF THE INVENTION

The present invention relates to a thin film transistor (TFT) and, more particularly, to an oxide TFT, a method for fabricating a TFT, a display device having a TFT, and a method for fabricating the display device.

DESCRIPTION OF THE RELATED ART

Television products are the major application targets in the remarkably growing flat panel display market. Currently, a liquid crystal display (LCD) is a mainstream as a TV panel, and research into an application of an organic light emitting display device to TVs has been actively ongoing.

Current TV display techniques are focused on major items required in the market, and the requirements in the market include a large-scale TV or digital information display (DID), low cost, high picture quality (video representation performance, high resolution, brightness, contrast ratio, color gamut, and the like).

In order to meet the requirements, a thin film transistor (TFT) that may be applied as a switching and driving element of a display having excellent performance without increasing cost, together with an increase in the size of a substrate such as glass, or the like, is required.

Thus, development of techniques in the future is expected to be focused on securing a TFT fabrication technique capable of fabricating a display panel having excellent performance at low cost according to such tendency.

An amorphous silicon TFT (a-Si TFT) as a typical driving and switching element of a display is a currently commonly used element that may be uniformly formed on a large substrate having a size exceeding 2 m at low cost.

However, as displays tend to have a large size and high picture quality, high device performance is required, and thus, it is determined that an existing a-Si TFT having mobility of 0.5 cm2/Vs has reached a limitation.

Thus, a high performance TFT having mobility higher than that of a-Si TFT and a fabrication technique thereof are required. Also, a-Si TFT has a problem of reliability in that as it continues to operate, device characteristics continue to be degraded to result in a failure of maintaining initial performance.

This is the reason why the a-Si TFT is hardly applied to an organic light emitting diode (OLED) device that operates while a current is continuously applied, in comparison to an LCD driven by an AC.

A polycrystalline silicon TFT having remarkably high performance relative to an a-Si TFT has high mobility ranging from tens to hundreds of cm2/Vs, so it has performance applicable to a display having high picture quality hardly realized by the existing a-Si TFT and rarely degrades device characteristics according to an operation in comparison to the a-Si TFT. However, a fabrication of a poly-Si TFT requires a large number of processes in comparison to the a-Si TFT and investment in additional equipment should be made first.

Thus, p-Si TFT may be appropriately applied to make a display have high picture quality or applied to a product such as an OLED, or the like, but it is inferior to the existing a-Si TFT in terms of cost, so an application thereof is limited.

In particular, in the case of a p-Si TFT, due to a technical issue such as a limitation in fabrication equipment or a defect in uniformity, a fabrication process using a large substrate having a size of 1 m has not been realized so far, so the difficulty of the p-Si TFT in its application to a TV product is a factor making it difficult for high performance p-Si TFT to be easily settled down in the market.

Thus, demand for a new TFT technique that may support the advantages (large size, low cost, and uniformity) of the a-Si TFT and the advantages (high performance and reliability) is highly on the rise, and research into the new TFT technique has been actively ongoing. An oxide semiconductor is a typical one thereof.

An oxide semiconductor has advantages in that it has high mobility in comparison to an a-Si TFT and simpler fabrication process and lower fabrication cost in comparison to a polycrystalline silicon (p-Si) TFT, and thus, it is of a high utility value in an LCD or an OLED.

In this point of view, a structure of an oxide TFT according to the related art using an oxide semiconductor will be described with reference to FIGS. 1 and 2.

FIG. 1 is a plan view of an oxide TFT structure according to the related art.

FIG. 2 is a schematic sectional view of the oxide TFT according to the related art, taken along line II-II in FIG. 1.

FIG. 3 is a cross-sectional view taken along line III-III in FIG. 1 and schematically illustrating a state in which a gate electrode, an active layer, and an etch stop layer overlap with each other.

As shown in FIGS. 1 to 3, the related art oxide TFT 10 includes a gate electrode 13 patterned on a substrate 11 and having a certain width and length, a gate insulating layer 15 formed on the entire surface of the substrate 11 including the gate electrode 13, an active layer pattern 17 formed of an oxide semiconductor on the gate insulating layer 15 above the gate electrode 13 and patterned to have a predetermined shape, an etch stop layer 19 formed on the active layer 17 and patterned to have a predetermined shape, and a source electrode 21 and a drain electrode 23 spaced apart from one another at an upper portion of the etch stop layer 19 and formed on upper portions of the active layer 17 and the gate insulating layer 15.

Here, the active layer 17 may be made of any one of oxide semiconductors including IGZO, ITZO, IZO, and AGZO.

As indicated by "A" in FIG. 2, the active layer 17 is formed to extend to an outer region of the gate electrode 13, so a portion thereof is exposed to the outside. Thus, when the TFT is applied to a display device, e.g., an LCD device, the active layer 17 exposed from the outside of the gate electrode 13 is exposed to ambient light, e.g., light supplied to a backlight unit under a substrate.

Also, as indicated by "B" in FIG. 3, the active layer 17 is not completely covered by the source electrode 21 and the drain electrode 23 and a portion thereof is exposed to the outside. Thus, when the TFT is applied to a display device, e.g., an organic luminescence emitted diode (OLED) device, a portion of light scattered-reflected from an organic light emitting layer within the OLED device enters the active layer 17 through an upper exposed portion of the active layer 17.

As described above, in the oxide TFT structure according to the related art, an existing amorphous silicon TFT (a-Si TFT) or a polycrystalline silicon TFT (poly-Si TFT) is free of degradation of the element according to light irradiation, so the TFT is formed without any limitation in a structure in which a large active layer 17 is formed in consideration of a processing margin and the source electrode 21 and the drain electrode 23 completely cover the active layer in a channel width direction.

However, in the case of the TFT employing oxide semiconductor according to the related art, when light irradiated, the element may be degraded. Thus, when the active layer 17 is formed to be larger than the gate electrode 13 as shown in FIG. 1, the active layer 17 is directly exposed to light provided from the lower portion of the substrate 11, e.g., from the backlight, degrading reliability of the element.

Also, the existing active layer 17 is formed to be larger than the source electrode 21 and the drain electrode 23, a portion of the active layer 17 exposed to the outside by light scattered-reflected within the element is exposed to degrade reliability of the element.

In particular, unlike the amorphous silicon (a-Si) or polycrystalline silicon (poly-Si) semiconductor characteristics, and when light is irradiated to the oxide semiconductor, characteristics of the oxide semiconductor are changed. Thus, when a negative bias is applied to a TFT having such an oxide semiconductor, a threshold voltage is rapidly shifted in a negative direction, degrading reliability.

Thus, when the related art TFT structure employing oxide semiconductor is applied as an element of a liquid crystal panel using a backlight and an OLED device employing compensation pixels, the element cannot be normally driven due to scattered-reflection of light generated from the organic light emitting layer.

SUMMARY OF THE INVENTION

An aspect of the present invention provides an oxide thin film transistor (TFT) capable of enhancing element reliability by preventing light supplied from the exterior or interior of an element from being made incident to an active layer, a method for fabricating the TFT, a display device having the TFT, and a method for fabricating the display device.

Another aspect of the present invention provides an oxide thin film transistor (TFT) capable of enhancing element reliability by minimizing a degree of scattered-reflection of light entering from a backlight or the exterior by employing a structure in which an etch stop layer pattern, a source electrode, and a drain electrode cover an active layer pattern, a method for fabricating the TFT, a display device having the same, and a method for fabricating the display device.

Another aspect of the present invention provides an oxide thin film transistor (TFT) capable of enhancing element reliability by lowering scattered-reflection of light and a threshold voltage (Vth) by covering a TFT part as a non-pixel region with a dummy color filter layer pattern in a color filter on TFT (COT) structure.

According to an aspect of the present invention, there is provided an oxide thin film transistor (TFT) including: a gate electrode formed on a substrate; a gate insulating layer formed on the entire surface of the substrate including the gate electrode; an active layer pattern formed on the gate insulating layer above the gate electrode and completely overlapping the gate electrode; an etch stop layer pattern formed on the active layer pattern and the gate insulating layer; and a source electrode and a drain electrode formed on the gate insulating layer including the etch stop layer pattern and the active layer pattern and spaced apart from one another, and overlapping both sides of the etch stop layer pattern and the underlying active layer pattern.

According to another aspect of the present invention, there is provided a method for fabricating an oxide thin film transistor (TFT) including: forming a gate electrode on a substrate; forming a gate insulating layer on the entire surface of the substrate including the gate electrode; forming an active layer pattern on the gate insulating layer above the gate electrode such that the active layer patterns completely overlaps the gate electrode; forming an etch stop layer pattern on the active layer pattern and the gate insulating layer; and forming a source electrode and a drain electrode on the gate insulating layer including the etch stop layer pattern and the active layer pattern such that the source electrode and the drain electrode overlap both sides of the etch stop layer pattern and the underlying active layer pattern.

According to another aspect of the present invention, there is provided an organic light emitting diode (OLED) display device (or an organic electroluminescence device) including an oxide thin film transistor (TFT), including: a lower substrate on which a non-pixel region and a light emitting region are defined; a thin film transistor (TFT) formed in the non-pixel region of the lower substrate and including a gate electrode, a gate insulating layer formed on the entire surface of the lower substrate including the gate electrode, an active layer pattern formed on the gate insulating layer above the gate electrode and completely overlapping the gate electrode, an etch stop layer pattern formed on the active layer pattern and the gate insulating layer, a source electrode and a drain electrode formed on the gate insulating layer including the etch stop layer pattern and the active layer pattern and spaced apart from one another, and overlapping both sides of the etch stop layer pattern and the underlying active layer pattern; a passivation layer formed on the entire surface of the lower substrate including the TFT; a plurality of color filter layers formed on the passivation layer of the light emitting region of the lower substrate; a dummy color filter layer pattern formed on the passivation layer of the non-pixel region of the lower substrate; an organic insulating layer formed on the entire surface of the lower substrate including the color filter layers and the dummy color filter layer pattern; drain electrode contact holes formed on the organic insulating layer, the dummy color filter layer pattern, and the passivation layer, and exposing the drain electrode of the TFT; a first electrode formed on the organic insulating layer and electrically connected to the drain electrode through the drain electrode contact hole; a bank layer formed on the organic insulating layer of the non-pixel region of the lower substrate; an organic light emitting layer formed on the entire surface of the lower substrate including the first electrode; and an upper substrate attached to an upper portion of the organic light emitting layer and having a second electrode formed thereon.

According to another aspect of the present invention, there is provided a method for fabricating an organic light emitting diode display device having an oxide thin film transistor (TFT), including: providing a lower substrate on which a non-pixel region and a light emitting region are defined; forming a thin film transistor (TFT) in the non-pixel region of the lower substrate, the TFT including a gate electrode, a gate insulating layer formed on the entire surface of the lower substrate including the gate electrode, an active layer pattern formed on the gate insulating layer above the gate electrode and completely overlapping the gate electrode, an etch stop layer pattern formed on the active layer pattern and the gate insulating layer, a source electrode and a drain electrode formed on the gate insulating layer including the etch stop layer pattern and the active layer pattern and spaced apart from one another, and overlapping both sides of the etch stop layer pattern and the underlying active layer pattern; forming a passivation layer on the entire surface of the lower substrate including the TFT; forming a plurality of color filter layers on the passivation layer of the light emitting region of the lower substrate and forming a dummy color filter layer pattern on the passivation layer of the non-pixel region of the lower substrate; forming an organic insulating layer on the entire surface of the lower substrate including the color filter layers and the dummy color filter layer pattern; forming drain electrode contact holes, exposing the drain electrode of the TFT, on the organic insulating layer, the dummy color filter layer pattern, and the passivation layer; forming a first electrode electrically connected to the drain electrode through the drain electrode contact hole, on the organic insulating layer; forming a bank layer on the organic insulating layer of the non-pixel region of the lower substrate; forming an organic light emitting layer on the entire surface of the lower substrate including the first electrode; and attaching an upper substrate with a second electrode formed thereon to an upper portion of the organic light emitting layer.

According to another aspect of the present invention, there is provided a liquid crystal display device including an oxide thin film transistor (TFT), including: a lower substrate and an upper substrate on which a non-pixel region and a pixel region are defined, respectively; a TFT formed in the non-pixel region of the lower substrate and including a gate electrode, a gate insulating layer formed on the entire surface of the lower substrate including the gate electrode, an active layer pattern formed on the gate insulating layer above the gate electrode and completely overlapping the gate electrode, an etch stop layer pattern formed on the active layer pattern and the gate insulating layer, a source electrode and a drain electrode formed on the gate insulating layer including the etch stop layer pattern and the active layer pattern and spaced apart from one another, and overlapping both sides of the etch stop layer pattern and the underlying active layer pattern; a passivation layer formed on the entire surface of the lower substrate including the TFT; a plurality of color filter layers formed on the passivation layer of the pixel region of the lower substrate; a dummy color filter layer pattern formed on the passivation layer of the non-pixel region of the lower substrate; an organic insulating layer formed on the entire surface of the lower substrate including the color filter layers and the dummy color filter layer pattern; drain electrode contact holes formed on the organic insulating layer, the dummy color filter layer pattern, and the passivation layer, and exposing the drain electrode of the TFT; a pixel electrode formed on the organic insulating layer and electrically connected to the drain electrode through the drain electrode contact hole; a black matrix formed in the non-pixel region of the upper substrate and a common electrode formed on the entire surface of the upper substrate including the black matrix; and a liquid crystal layer formed between the lower substrate and the upper substrate.

The oxide thin film transistor (TFT) a method for fabricating the TFT, a display device having the TFT, and a method for fabricating the display device according to embodiments of the present invention have the following advantages.

In the case of the oxide thin film transistor (TFT) a method for fabricating the TFT, a display device having the TFT, and a method for fabricating the display device according to embodiments of the present invention, since the structure in which a line width of the gate electrode is larger than that of the active layer pattern in order to block light directly incident from a lower side of the substrate and the etch stop layer pattern, the source electrode, and the drain electrode fully cover the active layer pattern in order to prevent additional degradation due to scattered-reflection of incident light is employed, a degradation of element reliability due to scattered-reflection of light can be prevented.

Also, in the case of the oxide thin film transistor (TFT), the method for fabricating the TFT, the display device having the TFT, and the method for fabricating the display device according to embodiments of the present invention, since the dummy color filter layer pattern covers the TFT region as a non-pixel region in forming the color filter layer in the color filter on TFT (COT) structure, scattered-reflection of light and a threshold voltage Vth are lowered to improve element reliability.

The foregoing and other objects, features, aspects and advantages of the present invention will become more apparent from the following detailed description of the present invention when taken in conjunction with the accompanying drawings.

DETAILED DESCRIPTION OF THE INVENTION

An oxide thin film transistor (TFT) structure according to embodiments of the present invention will be described in detail with reference to the accompanying drawings.

Figure 1:
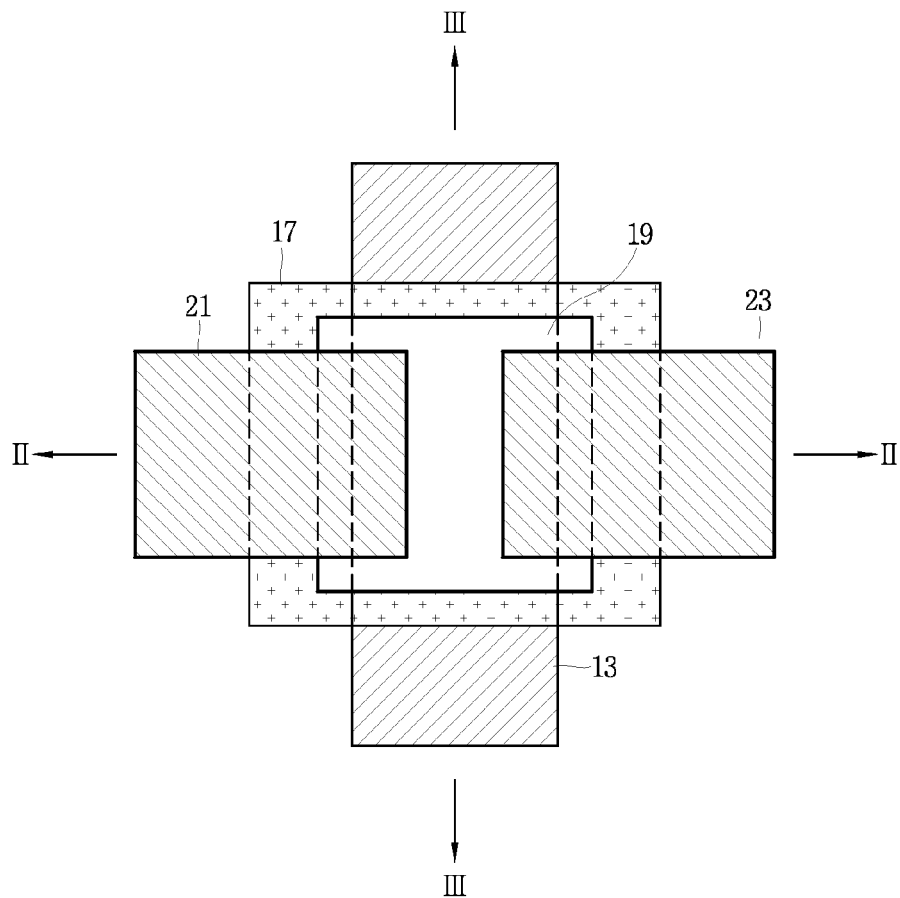
FIG. 1 is a plan view illustrating an oxide thin film transistor (TFT) structure according to the related art.
Figure 2:
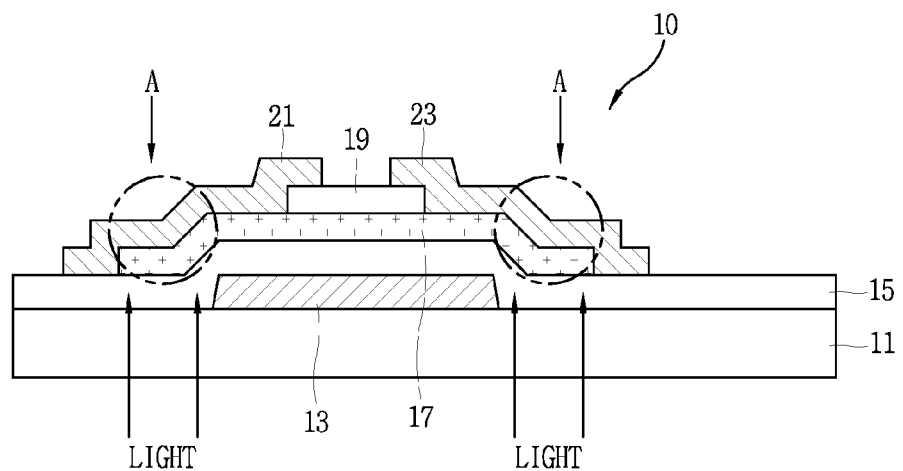
FIG. 2 is a schematic sectional view of the oxide TFT according to the related art, taken along line II-II in FIG. 1.
Figure 3:
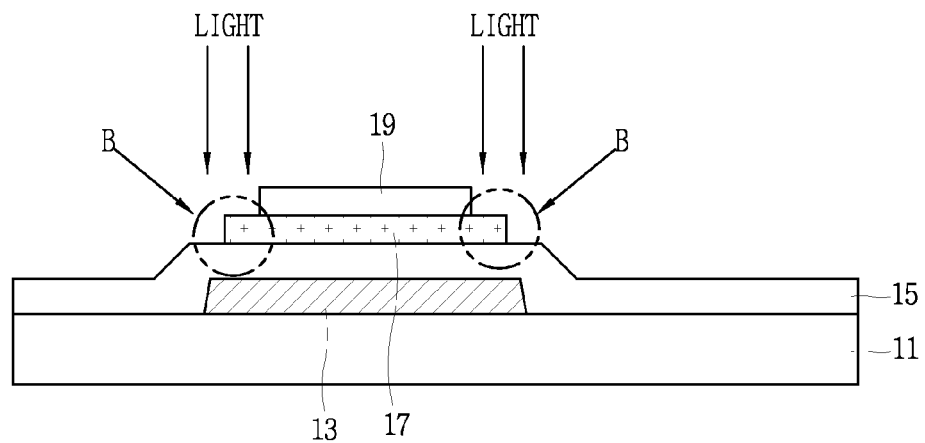
FIG. 3 is a cross-sectional view taken along III-III in FIG. 1, schematically illustrating an overlap state of a gate electrode, an active layer pattern, and an etch stop layer pattern.
Figure 4:
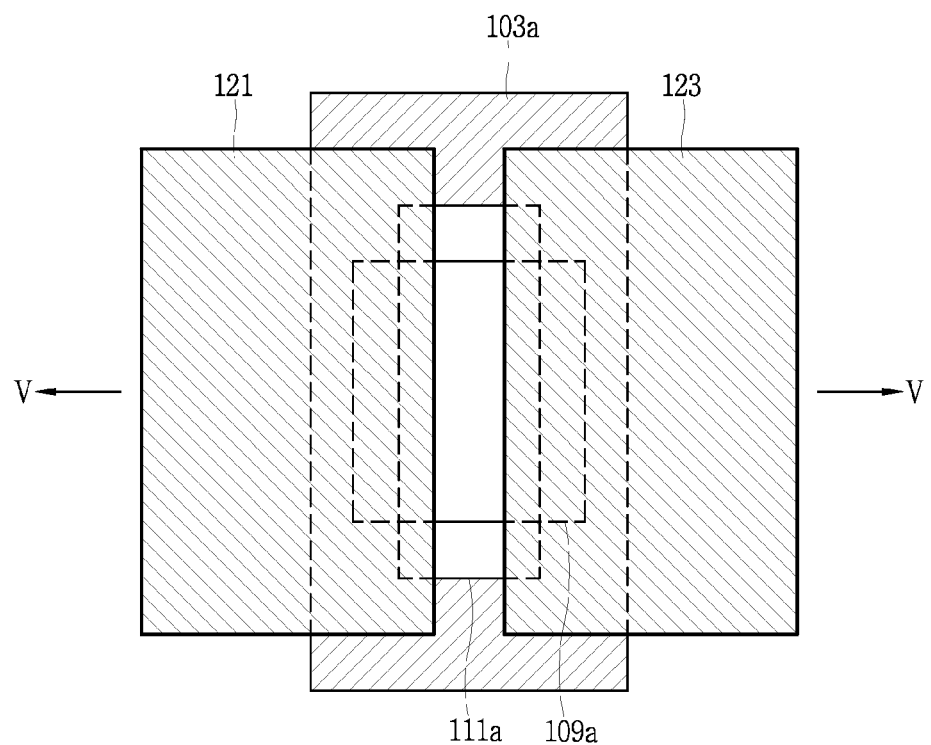
FIG. 4 is a plan view illustrating a structure of an oxide TFT according to an embodiment of the present invention.

FIG. 4 is a plan view illustrating a structure of an oxide TFT according to an embodiment of the present invention.

Figure 5:
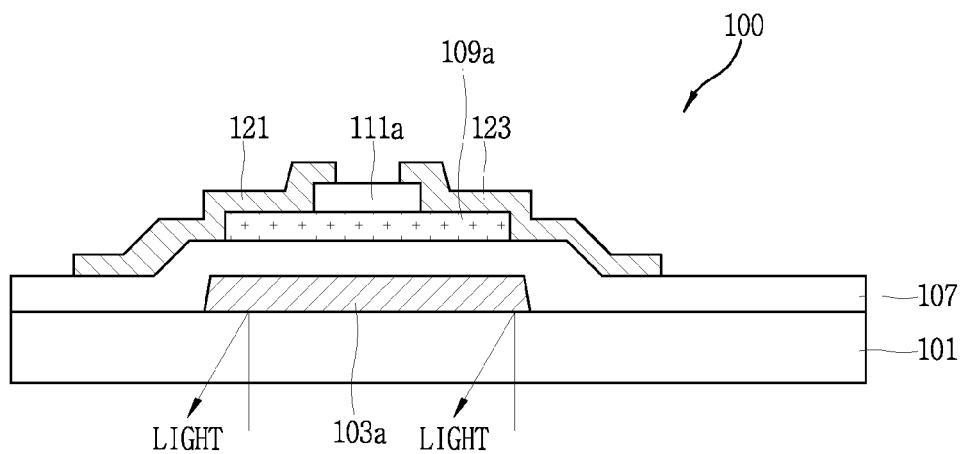
FIG. 5 is a cross-sectional view taken along line V-V in FIG. 4, schematically illustrating an oxide thin film transistor (TFT) according to an embodiment of the present invention.

FIG. 5 is a cross-sectional view taken along line V-V in FIG. 4, schematically illustrating an oxide thin film transistor (TFT) according to an embodiment of the present invention.

As illustrated in FIGS. 4 and 5, an oxide TFT 100 according to an embodiment of the present invention includes a gate electrode 103a formed on a substrate 101; a gate insulating layer 107 formed on the entire surface of the substrate 101 including the gate electrode 103a; an active layer pattern 109a formed on the gate insulating layer 107 above the gate electrode 103a and completely overlapping the gate electrode 103a; an etch stop layer pattern 111a formed on the active layer pattern 109a and the gate insulating layer 107; and a source electrode 121 and a drain electrode 123 formed on the gate insulating layer 107 including the etch stop layer pattern 111a and the active layer pattern 109a and spaced apart from one another, and overlapping both sides of the etch stop layer pattern 111a and the underlying active layer pattern 109a.

Here, the gate electrode 103a may be made of silicon, glass, plastic, or any other appropriate material, or may be made of a metal or any other appropriate conductive material. For example, the gate electrode 103a may be made of any one selected from the group consisting of indium tin oxide (ITO), gallium zinc oxide (GZO), indium gallium zinc oxide (IGZO), indium gallium oxide (IGO), indium zinc oxide (IZO), indium zinc oxide (IZO), indium oxide (In2O3), a combination of two or more of them, or any other appropriate material(s). Also, a material used to form the gate electrode 103a may include any one selected from a conductive metal group consisting of aluminum (Al), tungsten (W), copper (Cu), molybdenum (Mo), chromium (Cr), titanium (Ti), molybdenum tungsten (MoW), molybdenum titanium (MoTi), copper/molybdenum titanium (Cu/MoTi), a combination of two or more of them, or any other appropriate material.

Also, the gate insulating layer 107 may be made of any one selected from the group consisting of silicon oxide (SiO2), silicon nitride (SiNx), zirconium oxide (ZrO2), hafnium oxide (HfO2), titanium oxide (TiO2), tantalum oxide (Ta2O5), a barium-strontium-titanium-oxygen compound (Ba—Sr—Ti—O), and a bismuth-zinc-niobium-oxygen compound (Bi—Zn—Nb—O), a combination of two or more of them, or any other appropriate material.

The active layer pattern 109, a layer serving to form a channel allowing electrons to move therein between the source electrode 121 and the drain electrode 123, is made of an oxide semiconductor including silicon (Si) instead of a low temperature polysilicon (LTPS) or an amorphous silicon (a-Si) material.

In this case, the oxide semiconductor may be obtained by adding silicon (Si) to an oxide semiconductor including one or more selected from the group consisting of germanium (Ge), tin (Sn), lead (Pb), indium (In), titanium (Ti), gallium (Ga), and aluminum (Al), and zinc (Zn). For example, the active pattern 109a may be made of silicon indium zinc oxide (Si—InZnO (SIZO)) obtained by adding silicon ions to a composite indium zinc oxide (InZnO).

When the active layer pattern 109 is made of SIZO, a composition ratio of the content of silicon (Si) atoms to the entire content of zinc (Zn), indium (In), and silicon (Si) atoms in the active layer pattern may ranging from about 0.001 wt % to about 30 wt %. As the content of the silicon (Si) atoms is increased, the role of controlling generation of electrons of the active layer pattern 109 is strengthened to potentially lower mobility, but element stability may be better.

Meanwhile, besides the foregoing materials, the active layer pattern 109 may further include a Group I element such as lithium (Li) or potassium (K), a Group II element such as magnesium (Mg), calcium (Ca), or strontium (Sr), a Group III element such as gallium (Ga), aluminum (Al), indium (In), or yttrium (Y), Group IV element such as titanium (Ti), zirconium (Zr), silicon (Si), tin (Sn), or geranium (Ge), a Group V element such as tantalum (Ta), vanadium (V), niobium (Nb), or antimony (Sb), or may further include lanthanides elements such as lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu).

Also, the etch stop layer pattern 111a may be made of any one selected from inorganic insulating materials including silicon oxide (SiO2) and silicon nitride (SiNx).

Also, the source electrode 121 and the drain electrode 123 are made of the same material as that of the gate electrode. Namely, the source electrode 121 and the drain electrode 123 may be made of a metal or any other conductive material. For example, the source electrode 121 and the drain electrode 123 may be made of any one selected from the group consisting of indium tin oxide (ITO), gallium zinc oxide (GZO), indium gallium zinc oxide (IGZO), indium gallium oxide (IGO), indium zinc oxide (IZO), indium zinc oxide (IZO), indium oxide (In2O3), a combination of two or more of them, or any other appropriate material(s). Also, a material used to form source electrode 121 and the drain electrode 123 may include any one selected from a conductive metal group consisting of aluminum (Al), tungsten (W), copper (Cu), molybdenum (Mo), chromium (Cr), titanium (Ti), molybdenum tungsten (MoW), molybdenum titanium (MoTi), copper/molybdenum titanium (Cu/MoTi), a combination of two or more of them, or any other appropriate material.

Here, a line width of the gate electrode 103a may be greater than that of the active layer pattern 109a, and the active layer pattern 109a completely overlaps the gate electrode 103a.

Also, the etch stop layer pattern 111a overlaps the active layer pattern 109a and the gate electrode 103a.

The source electrode 121 and the drain electrode 123 overlap both sides of the etch stop layer pattern 111a and underlying active layer pattern 109a and the gate electrode 103a.

Thus, an upper portion of the active layer pattern 109a is completely covered by the etch stop layer pattern 111a, the source electrode 121, and the drain electrode 123, and a lower portion thereof is completely covered by the gate electrode 103a.

In this manner, in order to block light directly made incident from a lower side of the substrate, a line width of the gate electrode 103a is formed to be larger than that of the active layer pattern 109a, and in order to prevent an additional degradation due to scattered-reflection of incident light, the active layer pattern 109a is completely covered by the etch stop layer pattern 111a, the source electrode 121, and the drain electrode 123, thereby preventing element reliability resulting from scattered-reflection of light.

Meanwhile, a method for fabricating an oxide TFT according to an embodiment of the present invention having the foregoing configuration as described above will be described in detail with reference to the accompanying drawings.

FIGS. 6A to 6H are sectional views illustrating a fabrication process of the oxide TFT according to an embodiment of the present invention.

Figure 6A:
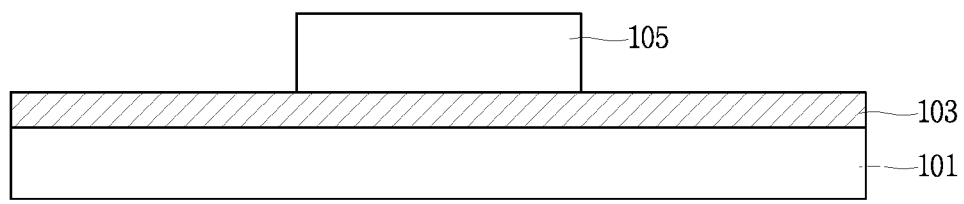
FIGS. 6A to 6H are sectional views illustrating a process of fabricating an oxide TFT according to an embodiment of the present invention.

Referring to FIG. 6A, a first conductive material for a gate electrode is deposited on the substrate 101 through a sputtering method to form a first conductive layer 103, on which a first photosensitive layer (not shown) is coated and patterned through a first masking process using photolithography to form the first photosensitive layer pattern 105.

In this case, the first conductive layer 103 may be made of silicon, glass, plastic, or any other appropriate material, or may be made of a metal or any other appropriate conductive material. For example, the gate electrode 103a may be made of any one selected from the group consisting of indium tin oxide (ITO), gallium zinc oxide (GZO), indium gallium zinc oxide (IGZO), indium gallium oxide (IGO), indium zinc oxide (IZO), indium zinc oxide (IZO), indium oxide (In2O3), a combination of two or more of them, or any other appropriate material(s). Also, a material used to form the first conductive layer 103 may include any one selected from a conductive metal group consisting of aluminum (Al), tungsten (W), copper (Cu), molybdenum (Mo), chromium (Cr), titanium (Ti), molybdenum tungsten (MoW), molybdenum titanium (MoTi), copper/molybdenum titanium (Cu/MoTi), a combination of two or more of them, or any other appropriate material.

Figure 6B:
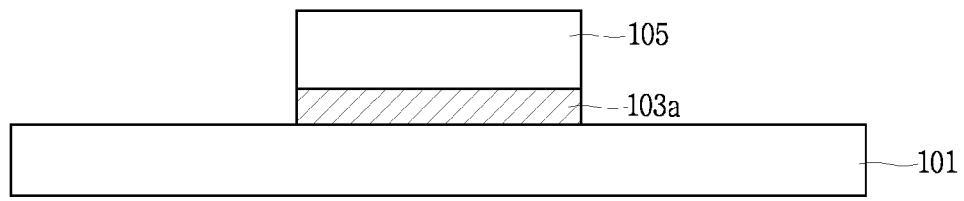

Thereafter, referring to FIG. 6B, the first conductive layer 103 is selectively etched by using the first photosensitive layer pattern 105 as an etch mask to form the gate electrode 103a.

Figure 6C:
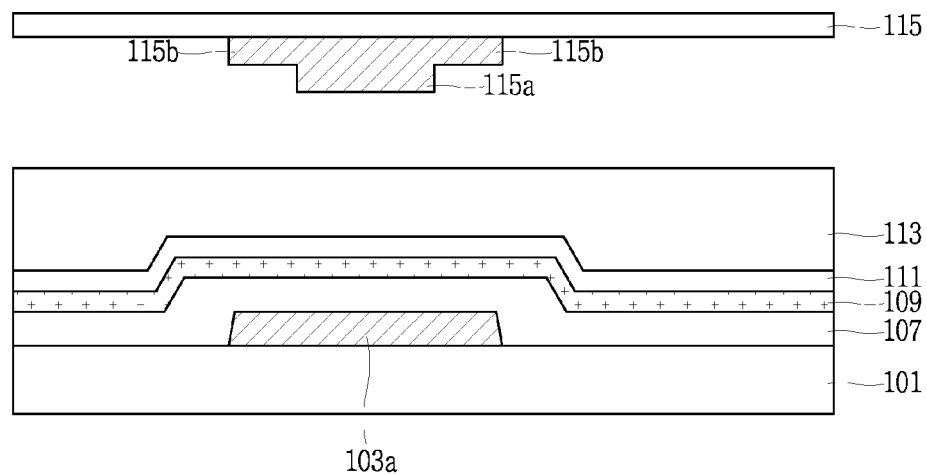

Subsequently, referring to FIG. 6C, the first photosensitive layer pattern 105 is removed, and the gate insulating layer 107 is formed on the entire surface of the substrate including the gate electrode 103a. In this case, the gate insulating layer 107 may be made of any one selected from the group consisting of silicon oxide ($SiO_2$), silicon nitride ($SiN_x$), zirconium oxide ($ZrO_2$), hafnium oxide ($HfO_2$), titanium oxide ($TiO_2$), tantalum oxide ($Ta_2O_5$), a barium-strontium-titanium-oxygen compound (Ba—Sr—Ti—O), and a bismuth-zinc-niobium-oxygen compound (Bi—Zn—Nb—O), a combination of two or more of them, or any other appropriate material.

Subsequently, the active layer pattern 109 and the etch stop layer pattern 111 are sequentially formed by using an oxide semiconductor material on the gate insulating layer 107, and a second photosensitive layer 113 is coated thereon. Here, the active layer pattern 109, serving to form a channel in which electrons move between the source electrode 121 and the drain electrode 123, is made of an oxide semiconductor including silicon (Si) instead of LTPS or amorphous silicon (a-Si).

Here, the oxide semiconductor may be obtained by adding silicon (Si) to an oxide semiconductor including one or more selected from the group consisting of germanium (Ge), tin (Sn), lead (Pb), indium (In), titanium (Ti), gallium (Ga), and aluminum (Al), and zinc (Zn). For example, the active pattern 109a may be made of silicon indium zinc oxide (Si—InZnO (SIZO)) obtained by adding silicon ions to a composite indium zinc oxide (InZnO).

When the active layer pattern 109 is made of SIZO, a composition ratio of the content of silicon (Si) atoms to the entire content of zinc (Zn), indium (In), and silicon (Si) atoms in the active layer pattern may ranging from about 0.001 wt % to about 30 wt %. As the content of the silicon (Si) atoms is increased, the role of controlling generation of electrons of the active layer pattern 109 is strengthened to potentially lower mobility, but element stability may be better.

Meanwhile, besides the foregoing materials, the active layer pattern 109 may further include a Group I element such as lithium (Li) or potassium (K), a Group II element such as magnesium (Mg), calcium (Ca), or strontium (Sr), a Group III element such as gallium (Ga), aluminum (Al), indium (In), or yttrium (Y), Group IV element such as titanium (Ti), zirconium (Zr), silicon (Si), tin (Sn), or geranium (Ge), a Group V element such as tantalum (Ta), vanadium (V), niobium (Nb), or antimony (Sb), or may further include lanthanides elements such as lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu).

Also, the etch stop layer pattern 111 is made of one selected from an inorganic insulating material including a silicon oxide ($SiO_2$) and a silicon nitride ($SiN_x$).

Subsequently, referring to FIG. 6C, an exposure process is performed through photolithograph using a half-tone mask 115. Here, the half-tone mask 115 includes a first light blocking pattern 115a and a second light blocking pattern 115b. The first light blocking pattern 115a serves to block entire light, and the second light blocking pattern 115b serves to allow a portion of light to be transmitted therethrough and block the other remaining portion of light.

Figure 6D:
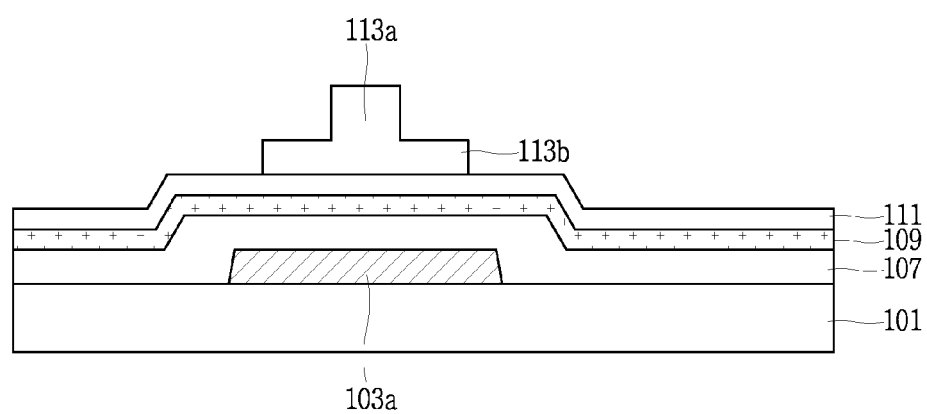

Thereafter, referring to FIG. 6D, the second photosensitive layer 113 part through which light was transmitted through the expose process is removed through a developing process to form second photosensitive layer patterns 113a and 113b having different thicknesses.

Figure 6E:
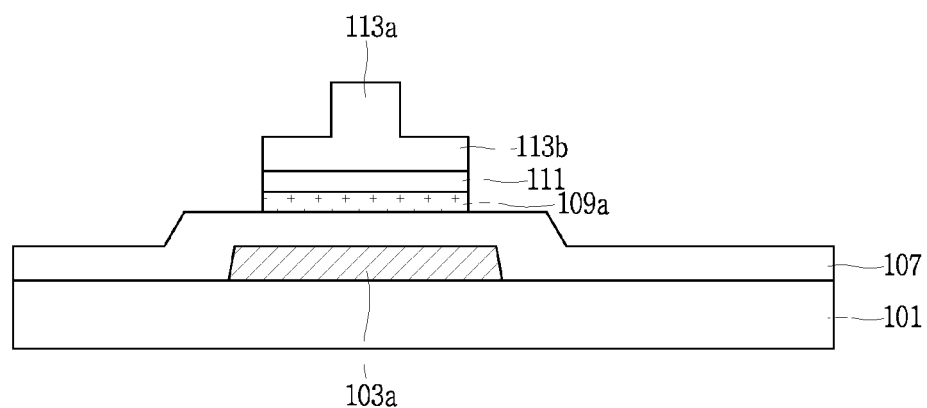

Subsequently, as illustrated in FIG. 6E, the etch stop layer pattern 111 and the active layer pattern 109 are selectively removed by using the second photosensitive layer patterns 113a and 113b as an etch mask to form the active layer pattern 109a on the gate insulating layer 107 above the gate electrode 103a. Here, the active layer pattern 109a has a line width smaller than that of the gate electrode 103a and completely overlaps the gate electrode 103a. Thus, the active layer pattern 109a is prevented from being directly exposed to light made incident from the outside of the substrate by the gate electrode 103a.

Figure 6F:
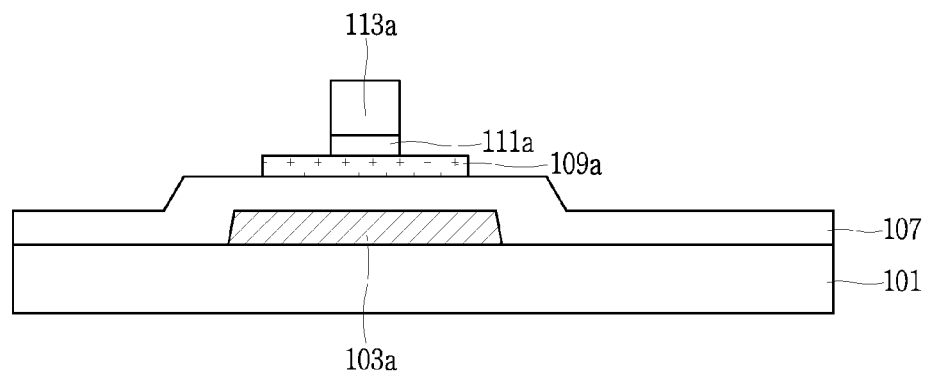

Thereafter, referring to FIG. 6F, an ashing process is performed to completely remove the second photosensitive layer pattern 113b among the second photosensitive layer patterns 113a and 113b. Here, portions of the second photosensitive layer pattern 113a are also removed together. Also, as the second photosensitive layer pattern 113b is completely removed, a portion of the lower etch stop layer pattern 111 is exposed to the outside.

Thereafter, the exposed portion of the etch stop layer pattern 111 is selectively etched by using the second photosensitive layer pattern 113a as an etch mask to form the etch stop layer pattern 111a. Here, the etch stop layer pattern 111a is formed up to an external region including a channel region of the active layer pattern 109a.

Figure 6G:
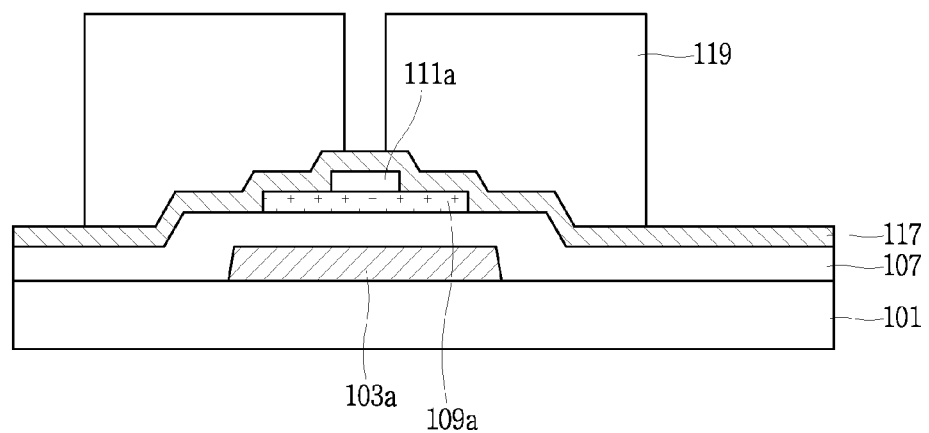

Subsequently, referring to FIG. 6G, the second photosensitive layer pattern 113a is removed, the second conductive layer 117 is deposited on the entire surface of the substrate including the etch stop layer pattern 11a through a sputtering method, and then, a third photosensitive layer (not shown) is coated thereon. Here, like the gate electrode 103a, the second conductive layer 117 may be made of a metal or any other appropriate material, like the gate electrode 103a. For example, the second conductive layer 117 may be made of any one selected from the group consisting of indium tin oxide (ITO), gallium zinc oxide (GZO), indium gallium zinc oxide (IGZO), indium gallium oxide (IGO), indium zinc oxide (IZO), indium zinc oxide (IZO), indium oxide ($In_2O_3$), a combination of two or more of them, or any other appropriate material(s). Also, a material used to form the third conductive layer 123 may include any one selected from a conductive metal group consisting of aluminum (Al), tungsten (W), copper (Cu), molybdenum (Mo), chromium (Cr), titanium (Ti), molybdenum tungsten (MoW), molybdenum titanium (MoTi), copper/molybdenum titanium (Cu/MoTi), a combination of two or more of them, or any other appropriate material.

Thereafter, a third photosensitive layer (not shown) is patterned through a masking process using a photolithograph process technique to form a third photosensitive layer pattern 119.

Figure 6H:
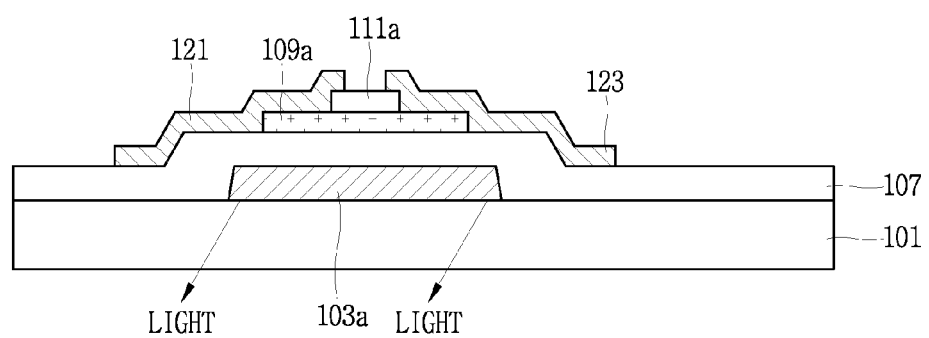

Subsequently, referring to FIG. 6H, the second conductive layer 117 is selectively etched by using the third photosensitive film pattern 119 to form the source electrode 121 and the drain electrode 123, thus completing the fabrication process of the oxide TFT according to an embodiment of the present invention. Here, the source electrode 121 and the drain electrode 123 overlap both sides of the etch stop layer pattern 111a and the underlying active layer pattern 109a and the gate electrode 103a.

Thus, the upper portion of the active layer pattern 109a is completely covered by the etch stop layer pattern 111a, the source electrode 121, and the drain electrode 123, and a lower portion of the active layer pattern 109a is completely covered by the gate electrode 103a.

In this manner, since the line width of the gate electrode 103a is formed to be greater than the line width of the active layer pattern 109a in order to block light directly made incident from the lower side of the substrate and the active layer pattern 109a is completely covered by the etch stop layer pattern 111a, the source electrode 121, and the drain electrode 123 in order to prevent an additional degradation due to scattered-reflection of incident light, a degradation of element reliability resulting from scattered-reflection of light can be prevented.

Thus, in the oxide TFT and the method for fabricating the same according to embodiments of the present invention, since the active layer pattern is made of an oxide semiconductor including silicon, it has high electron mobility and a production unit cost is lowered. Also, since the process of fabricating the active layer pattern can be performed at room temperature, the process can be facilitated.

The oxide TFT structure according to an embodiment of the present invention may be applied as various electronic elements such as a driving element or a switching element of a flat panel display such as a liquid crystal display (LCD), an organic luminescence emitted diode (OLED), or the like, or an element for configuring a peripheral circuit of a memory device.

Hereinafter, an organic light emitting diode display device having an oxide TFT according to another embodiment of the present invention will be described with reference to FIGS. 7 and 8.

Figure 7:
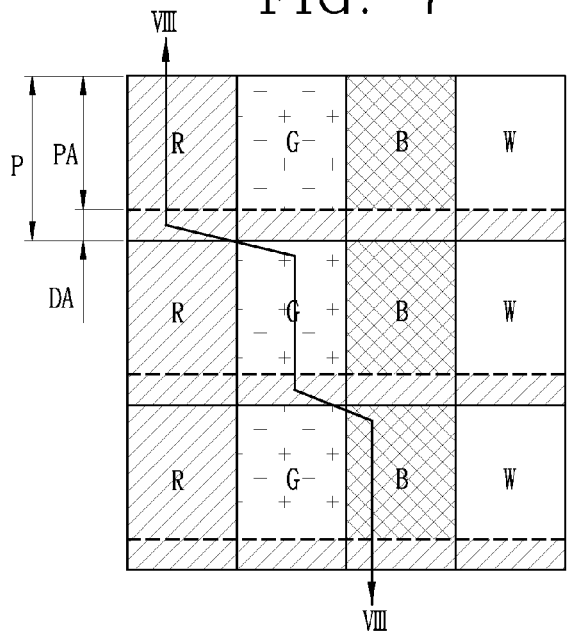
FIG. 7 is a plan view illustrating a concept that subpixels gather to form a single pixel in an organic light emitting diode display device according to another embodiment of the present invention.

FIG. 7 is a plan view illustrating a concept that subpixels gather to form a single pixel in an organic light emitting diode display device according to another embodiment of the present invention.

Figure 8:
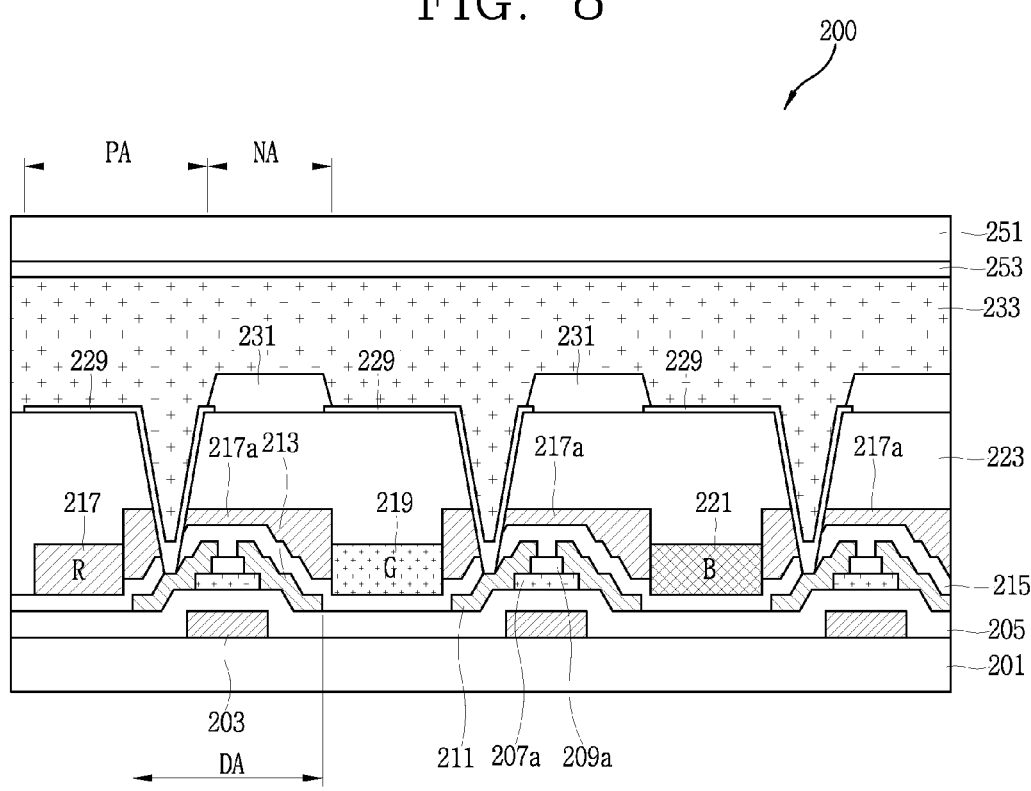
FIG. 8 is a cross-sectional view take along line VIII-VIII in FIG. 7, schematically illustrating an organic light emitting diode display device according to another embodiment of the present invention.

FIG. 8 is a cross-sectional view take along line VIII-VIII in FIG. 7, schematically illustrating an organic light emitting diode (OLED) display device according to another embodiment of the present invention.

As illustrated in FIG. 7, an OLED display device according to another embodiment of the present invention includes a plurality of subpixels emitting light of red (R), green (G), blue (B), and white (W), and R, G, B, and W subpixels constitute a single pixel P.

Meanwhile, as illustrated in FIG. 8, the OLED display device 200 according to another embodiment of the present invention may be classified into a top emission type OLED display device and a bottom emission type OLED display device according to a transmission direction of emitted light. Hereinafter, the bottom emission type OLED display device will be described as an example.

Also, for the description purpose, a region in which a driving TFT (not shown) is formed is defined as a driving region (DA), a region in which a bank 231 is formed is defined as a non-pixel region (NA), and a region in which color filter layers 217, 219, and 221 are formed is defined as a light emitting region (PA).

As illustrated in FIG. 8, the OLED display device 200 according to another embodiment of the present invention includes a lower substrate 201 on which a non-pixel region NA and a light emitting region PA are defined; a thin film transistor (TFT) (T) formed in the non-pixel region NA of the lower substrate 201 and including a gate electrode 203, a gate insulating layer 205 formed on the entire surface of the lower substrate 201 including the gate electrode 203, an active layer pattern 207a formed on the gate insulating layer 205 above the gate electrode 203 and completely overlapping the gate electrode 203, an etch stop layer pattern 209a formed on the active layer pattern 207a and the gate insulating layer 205, a source electrode 211 and a drain electrode 213 formed on the gate insulating layer 205 including the etch stop layer pattern 209a and the active layer pattern 207a and spaced apart from one another, and overlapping both sides of the etch stop layer pattern 209a and the underlying active layer pattern 207a; a passivation layer 215 formed on the entire surface of the lower substrate including the TFT (T); a plurality of color filter layers 217, 219, and 221 formed on the passivation layer 215 of the light emitting region PA of the lower substrate 201; a dummy color filter layer pattern 217a formed on the passivation layer 215 of the non-pixel region NA of the lower substrate 201; an organic insulating layer 233 formed on the entire surface of the lower substrate 201 including the color filter layers 217, 219, and 221 and the dummy color filter layer pattern 217a; drain electrode contact holes (See 227 in FIG. 9I) formed on the organic insulating layer 233, the dummy color filter layer pattern 217a, and the passivation layer 215, and exposing the drain electrode 213 of the TFT (T); a first electrode 229 formed on the organic insulating layer 223 and electrically connected to the drain electrode 213 through the drain electrode contact hole 227; a bank layer 231 formed on the organic insulating layer 223 of the non-pixel region NA of the lower substrate 201; an organic light emitting layer 233 formed on the entire surface of the lower substrate 201 including the first electrode 229; and an upper substrate 251 attached to an upper portion of the organic light emitting layer 233 and having a second electrode 253 formed thereon.

Here, although not shown, for example, the TFT (T) may be a bottom gate type TFT including a switching TFT and a driving TFT and made of an oxide semiconductor. The TFT (T) may also be formed as a top gate type TFT.

The gate electrode 203 of the TFT (T) may be made of silicon, glass, plastic, or any other appropriate material, or may be made of a metal or any other appropriate conductive material. For example, the gate electrode 203a may be made of any one selected from the group consisting of indium tin oxide (ITO), gallium zinc oxide (GZO), indium gallium zinc oxide (IGZO), indium gallium oxide (IGO), indium zinc oxide (IZO), indium zinc oxide (IZO), indium oxide (In2O3), a combination of two or more of them, or any other appropriate material(s). Also, a material used to form the gate electrode 203a may include any one selected from a conductive metal group consisting of aluminum (Al), tungsten (W), copper (Cu), molybdenum (Mo), chromium (Cr), titanium (Ti), molybdenum tungsten (MoW), molybdenum titanium (MoTi), copper/molybdenum titanium (Cu/MoTi), a combination of two or more of them, or any other appropriate material.

Also, the gate insulating layer 205 may be made of any one selected from the group consisting of silicon oxide (SiO2), silicon nitride (SiNx), zirconium oxide (ZrO2), hafnium oxide (HfO2), titanium oxide (TiO2), tantalum oxide (Ta2O5), a barium-strontium-titanium-oxygen compound (Ba—Sr—Ti—O), and a bismuth-zinc-niobium-oxygen compound (Bi—Zn—Nb—O), a combination of two or more of them, or any other appropriate material.

The active layer pattern 207a, a layer serving to form a channel allowing electrons to move therein between the source electrode 211 and the drain electrode 213, is made of an oxide semiconductor including silicon (Si) instead of a low temperature polysilicon (LTPS) or an amorphous silicon (a-Si) material.

In this case, the oxide semiconductor may be obtained by adding silicon (Si) to an oxide semiconductor including one or more selected from the group consisting of germanium (Ge), tin (Sn), lead (Pb), indium (In), titanium (Ti), gallium (Ga), and aluminum (Al), and zinc (Zn). For example, the active layer pattern 207a may be made of silicon indium zinc oxide (Si—InZnO (SIZO)) obtained by adding silicon ions to a composite indium zinc oxide (InZnO).

When the active layer pattern 207a is made of SIZO, a composition ratio of the content of silicon (Si) atoms to the entire content of zinc (Zn), indium (In), and silicon (Si) atoms in the active layer pattern may ranging from about 0.001 wt % to about 30 wt %. As the content of the silicon (Si) atoms is increased, the role of controlling generation of electrons of the active layer pattern is strengthened to potentially lower mobility, but element stability may be better.

Meanwhile, besides the foregoing materials, the active layer pattern 207a may further include a Group I element such as lithium (Li) or potassium (K), a Group II element such as magnesium (Mg), calcium (Ca), or strontium (Sr), a Group III element such as gallium (Ga), aluminum (Al), indium (In), or yttrium (Y), Group IV element such as titanium (Ti), zirconium (Zr), silicon (Si), tin (Sn), or geranium (Ge), a Group V element such as tantalum (Ta), vanadium (V), niobium (Nb), or antimony (Sb), or may further include lanthanides elements such as lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu).

Also, the etch stop layer pattern 209a may be made of any one selected from inorganic insulating materials including silicon oxide (SiO2) and silicon nitride (SiNx).

Also, the source electrode 211 and the drain electrode 213 are made of the same material as that of the gate electrode 203. The source electrode 211 and the drain electrode 213 may be made of a metal or any other conductive material, like the gate electrode 203a. For example, the source electrode 211 and the drain electrode 213 may be made of any one selected from the group consisting of indium tin oxide (ITO), gallium zinc oxide (GZO), indium gallium zinc oxide (IGZO), indium gallium oxide (IGO), indium zinc oxide (IZO), indium zinc oxide (IZO), indium oxide (In2O3), a combination of two or more of them, or any other appropriate material(s). Also, a material used to form the source portion 215a and the drain portion 215b may include any one selected from a conductive metal group consisting of aluminum (Al), tungsten (W), copper (Cu), molybdenum (Mo), chromium (Cr), titanium (Ti), molybdenum tungsten (MoW), molybdenum titanium (MoTi), copper/molybdenum titanium (Cu/MoTi), a combination of two or more of them, or any other appropriate material.

Here, a line width of the gate electrode 203 may be greater than that of the active layer pattern 207a, and the active layer pattern 207a completely overlaps the gate electrode 203.

Also, the etch stop layer pattern 209a overlaps the active layer pattern 207a and the gate electrode 203.

The source electrode 211 and the drain electrode 213 overlap both sides of the etch stop layer pattern 209a and underlying active layer pattern 207a and the gate electrode 203.

Thus, an upper portion of the active layer pattern 207a is completely covered by the etch stop layer pattern 209a, the source electrode 211, and the drain electrode 213, and a lower portion thereof is completely covered by the gate electrode 203.

In this manner, in order to block light directly made incident from a lower side of the substrate, a line width of the gate electrode 203 is formed to be larger than that of the active layer pattern 207a, and in order to prevent an additional degradation due to scattered-reflection of incident light, the active layer pattern 207a is completely covered by the etch stop layer pattern 209a, the source electrode 211, and the drain electrode 213, thereby preventing element reliability resulting from scattered-reflection of light.

Meanwhile, the R, G, B, and W color filter layers 217, 219, 221, are formed in the light emitting region PA of the lower substrate 201.

The four subpixels including the R, G, B, and W color filter layers 217, 219, 221, and not shown, respectively, constitute a single pixel P.

Also, the TFT (T) including a switching TFT and a driving TFT is formed in the non-pixel region NA, i.e., in the driving region DA, of the lower substrate 201. A dummy color filter layer pattern 217a made of the same material as that of the R color filter layer 217 is formed at an upper portion of the TFT (T). Here, the dummy color filter layer pattern 217a may be made of the same material as that of the green (G) and blue (B) color filter layers, as well as the same material as that of the red color filter layer 217, and in this case, the dummy color filter layer pattern 217a may be formed as a single layer or may be formed by laminating the forgoing materials. Thus, since the dummy color filter layer pattern 217a is formed at an upper portion of the TFT (T), it absorbs light emitted from the organic light emitting layer 233, preventing the light from being scatter-reflected and made incident to the interior of the TFT, thereby preventing a degradation of the TFT.

The organic light emitting layer 233 may be formed as a single layer made of a light emitting material or may be formed as multiple layers including a hole injection layer, a hole transport layer, an emitting material layer, an electron transport layer, and an electron injection layer in order to enhance luminous efficiency.

In the OLED display device 200, when a predetermined voltage is applied to the first electrode 229 and the second electrode 253 according to a selected color signal, holes injected from the first electrode 229 and electrons applied from the second electrode 253 are transported to the organic light emitting layer 233 to form excitons. When the excitons transition from an excited state to a ground state, white light is generated, and as the white light passes through the R, G, B, and W color filter layers 217, 219, 221, and not shown, it is emitted in a full color form.

A method for fabricating an OLED display device according to another embodiment of the present invention configured as described above will be described with reference to FIGS. 9A to 9M.

FIGS. 9A to 9M are sectional views showing a process of fabricating an organic light emitting diode display device including an oxide TFT according to another embodiment of the present invention.

Figure 9A:
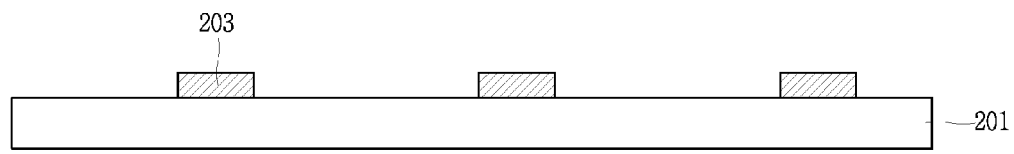
FIGS. 9A to 9M are sectional views showing a process of fabricating an organic light emitting diode display device including an oxide TFT according to another embodiment of the present invention.

Referring to FIG. 9A, a first conductive material for a gate electrode is deposited on the substrate 201 through a sputtering method to form a first conductive layer (not shown), on which a first photosensitive layer (not shown) is coated and patterned through a first masking process using photolithography to form the first photosensitive layer pattern (not shown).

In this case, the first conductive layer (not shown) may be made of silicon, glass, plastic, or any other appropriate material, or may be made of a metal or any other appropriate conductive material. For example, the gate electrode may be made of any one selected from the group consisting of indium tin oxide (ITO), gallium zinc oxide (GZO), indium gallium zinc oxide (IGZO), indium gallium oxide (IGO), indium zinc oxide (IZO), indium zinc oxide (IZO), indium oxide (In2O3), a combination of two or more of them, or any other appropriate material(s). Also, a material used to form the first conductive layer may include any one selected from a conductive metal group consisting of aluminum (Al), tungsten (W), copper (Cu), molybdenum (Mo), chromium (Cr), titanium (Ti), molybdenum tungsten (MoW), molybdenum titanium (MoTi), copper/molybdenum titanium (Cu/MoTi), a combination of two or more of them, or any other appropriate material.

Figure 9B:
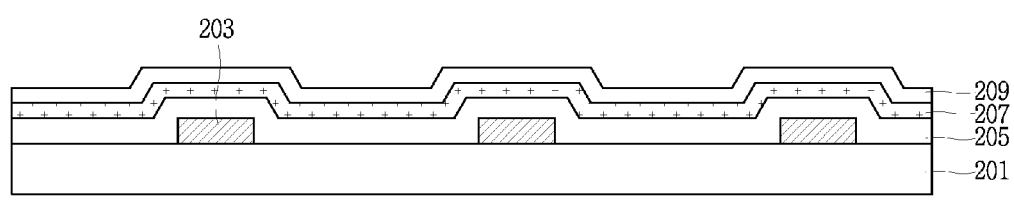

Thereafter, referring to FIG. 9B, the first conductive layer is selectively etched by using the first photosensitive layer pattern as an etch mask to form the gate electrode 203.

Subsequently, the first photosensitive layer pattern is removed, and the gate insulating layer 205 is formed on the entire surface of the substrate including the gate electrode 203. In this case, the gate insulating layer 205 may be made of any one selected from the group consisting of silicon oxide (SiO2), silicon nitride (SiNx), zirconium oxide (ZrO2), hafnium oxide (HfO2), titanium oxide (TiO2), tantalum oxide (Ta2O5), a barium-strontium-titanium-oxygen compound (Ba—Sr—Ti—O), and a bismuth-zinc-niobium-oxygen compound (Bi—Zn—Nb—O), a combination of two or more of them, or any other appropriate material.

Subsequently, the active layer pattern 207 and the etch stop layer pattern 209 are sequentially formed by using an oxide semiconductor material on the gate insulating layer 205, and a second photosensitive layer (not shown) is coated thereon. Here, the active layer pattern 207, serving to form a channel in which electrons move between the source electrode (not shown) and the drain electrode (not shown), is made of an oxide semiconductor including silicon (Si) instead of LTPS or amorphous silicon (a-Si).

Here, the oxide semiconductor may be obtained by adding silicon (Si) to an oxide semiconductor including one or more selected from the group consisting of germanium (Ge), tin (Sn), lead (Pb), indium (In), titanium (Ti), gallium (Ga), and aluminum (Al), and zinc (Zn). For example, the active pattern 109a may be made of silicon indium zinc oxide (Si—InZnO (SIZO)) obtained by adding silicon ions to a composite indium zinc oxide (InZnO).

When the active layer pattern 207 is made of SIZO, a composition ratio of the content of silicon (Si) atoms to the entire content of zinc (Zn), indium (In), and silicon (Si) atoms in the active layer pattern may ranging from about 0.001 wt % to about 30 wt %. As the content of the silicon (Si) atoms is increased, the role of controlling generation of electrons of the active layer pattern 109 is strengthened to potentially lower mobility, but element stability may be better.

Meanwhile, besides the foregoing materials, the active layer pattern 207 may further include a Group I element such as lithium (Li) or potassium (K), a Group II element such as magnesium (Mg), calcium (Ca), or strontium (Sr), a Group III element such as gallium (Ga), aluminum (Al), indium (In), or yttrium (Y), Group IV element such as titanium (Ti), zirconium (Zr), silicon (Si), tin (Sn), or geranium (Ge), a Group V element such as tantalum (Ta), vanadium (V), niobium (Nb), or antimony (Sb), or may further include lanthanides elements such as lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu).

Also, the etch stop layer pattern 209 is made of one selected from an inorganic insulating material including a silicon oxide (SiO2) and a silicon nitride (SiNx).

Subsequently, an exposure process is performed through photolithograph using a half-tone mask (not shown).

Thereafter, as illustrated in FIG. 6E, the etch stop layer pattern 209 and the active layer pattern 207 are selectively removed by using the second photosensitive layer patterns (not shown) as etch masks to form the active layer pattern 207a on the gate insulating layer 205 above the gate electrode 203. Here, the active layer pattern 207a has a line width smaller than that of the gate electrode 203 and completely overlaps the gate electrode 203. Thus, the active layer pattern 207a is prevented from being directly exposed to light made incident from the outside of the substrate by the gate electrode 203.

Figure 9C:
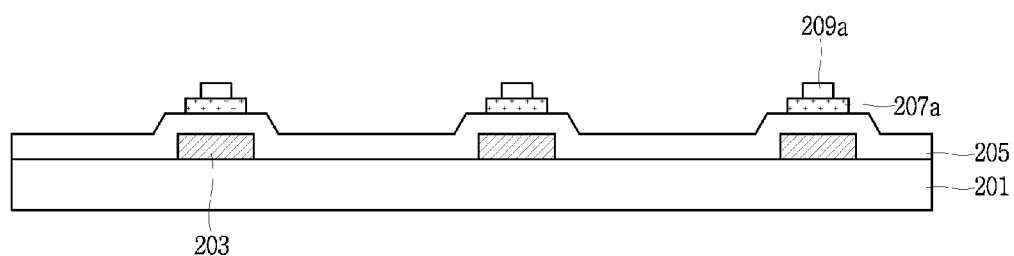

Thereafter, referring to FIG. 9C, the second photosensitive layer pattern (not shown) is selectively etched through an ashing process, and the exposed portion of the etch stop layer pattern 209 is selectively etched by using the remaining second photosensitive layer pattern (not shown) as an etch mask to form an etch stop layer pattern 209a. Here, the etch stop layer pattern 209a is formed up to an external region including a channel region of the active layer pattern 207a.

Subsequently, although not shown, the second photosensitive layer pattern (not shown) is removed, a second conductive layer (not shown) is deposited on the entire surface of the substrate including the etch stop layer pattern 209a through a sputtering method, and then, a third photosensitive layer (not shown) is coated thereon. Here, like the gate electrode 203, the second conductive layer may be made of a metal or any other appropriate material, like the gate electrode 103a. For example, the second conductive layer 117 may be made of any one selected from the group consisting of indium tin oxide (ITO), gallium zinc oxide (GZO), indium gallium zinc oxide (IGZO), indium gallium oxide (IGO), indium zinc oxide (IZO), indium zinc oxide (IZO), indium oxide (In2O3), a combination of two or more of them, or any other appropriate material(s). Also, a material used to form the third conductive layer 123 may include any one selected from a conductive metal group consisting of aluminum (Al), tungsten (W), copper (Cu), molybdenum (Mo), chromium (Cr), titanium (Ti), molybdenum tungsten (MoW), molybdenum titanium (MoTi), copper/molybdenum titanium (Cu/MoTi), a combination of two or more of them, or any other appropriate material.

Thereafter, a third photosensitive layer (not shown) is patterned through a masking process using a photolithograph process technique to form a third photosensitive layer pattern (not shown).

Figure 9D:
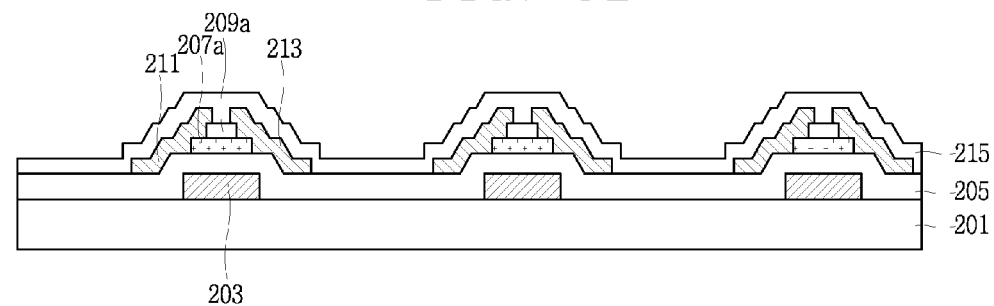

Subsequently, referring to FIG. 9D, the second conductive layer (not shown) is selectively etched by using the third photosensitive film pattern (not shown) as an etch mask to form the source electrode 211 and the drain electrode 213, thus forming an oxide TFT. Here, the source electrode 211 and the drain electrode 213 overlap both sides of the etch stop layer pattern 209a and the underlying active layer pattern 209a and the gate electrode 203.

Thus, the upper portion of the active layer pattern 207a is completely covered by the etch stop layer pattern 209a, the source electrode 211, and the drain electrode 213, and a lower portion of the active layer pattern 207a is completely covered by the gate electrode 203.

In this manner, since the line width of the gate electrode 203 is formed to be greater than the line width of the active layer pattern 207a in order to block light directly made incident from the lower side of the substrate and the active layer pattern 207a is completely covered by the etch stop layer pattern 209a, the source electrode 211, and the drain electrode 213 in order to prevent an additional degradation due to scattered-reflection of incident light, a degradation of element reliability resulting from scattered-reflection of light can be prevented.

Figure 9E:
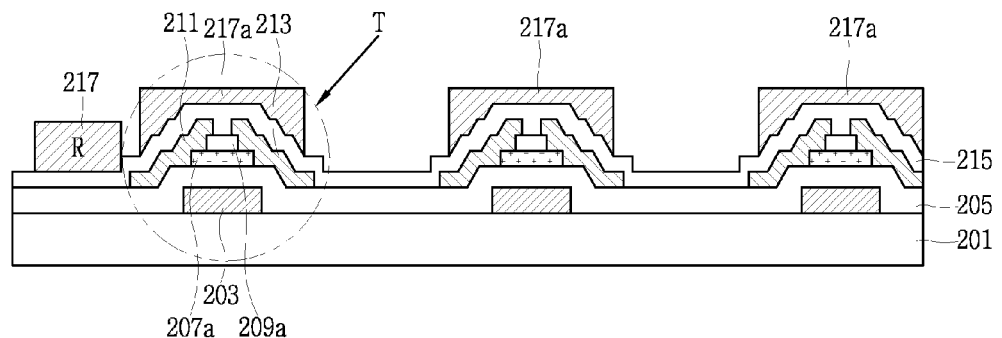

Thereafter, referring to FIG. 9E, the passivation layer 215 made of an inorganic insulating material and including a silicon notride layer is formed on the entire surface of the lower substrate 201.

Subsequently, after a red (R) color filter material is deposited on the passivation layer 215, an exposure process using a mask is performed thereon, and thereafter, the red (R) color filter material layer is selectively removed through a developing process to form the red (R) color filter layer 217 in the light emitting region PA of the lower substrate. Here, in forming the red (R) color filter layer 217 in the light emitting region PA of the lower substrate, the dummy color filter layer pattern 217a is formed on the TFT (T) formed in the non-pixel region NA, i.e., the driving region DA, of the respective subpixels, e.g., the red (R), green (G), blue (B), and white (W) subpixels. The dummy color filter layer pattern 217a may be made of the same material as that of the green (G) and blue (B) color filter layers, as well as the same material as that of the red color filter layer 217, and in this case, the dummy color filter layer pattern 217a may be formed as a single layer or may be formed by laminating the forgoing materials.

Thus, since the dummy color filter layer pattern 217a is formed at an upper portion of the TFT (T), it absorbs light emitted from the organic light emitting layer 233, preventing the light from being scatter-reflected and made incident to the interior of the TFT, thereby preventing a degradation of the TFT.

Figure 9F:
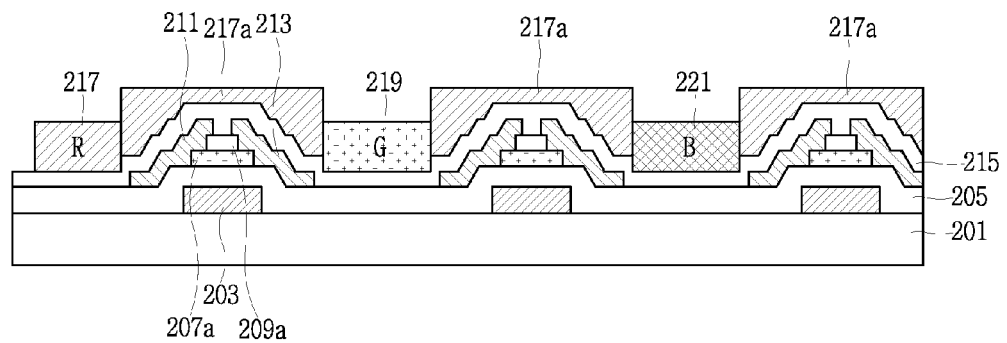

Thereafter, referring to FIG. 9F, the green (G) and blue (B) color filter layers 219 and 221 are additionally formed in the light emitting region PA corresponding to the other subpixel regions in the same manner as that for forming the red (R) color filter layer 217, and a color filter layer is not formed in the light emitting region PA corresponding to the white (W) subpixels. Here, the dummy color filter layer pattern 217a may be made of the same material as that of the green (G) and blue (B) color filter layers, as well as the same material as that of the red color filter layer 217, and in this case, the dummy color filter layer pattern 217a may be formed as a single layer or may be formed by laminating the forgoing materials.

Figure 9G:
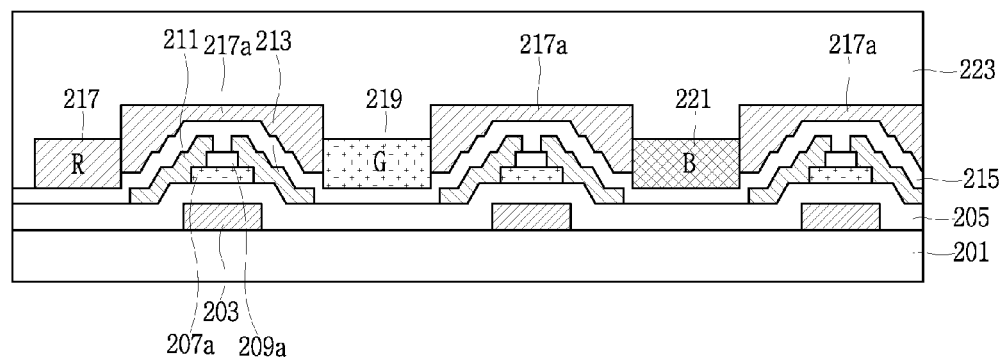

Subsequently, referring to FIG. 9G, the organic insulating layer 223 is deposited on the entire surface of the substrate including the plurality of color filter layers 217, 219, and 221, and the dummy color filter layer pattern 217a.

Figure 9H:
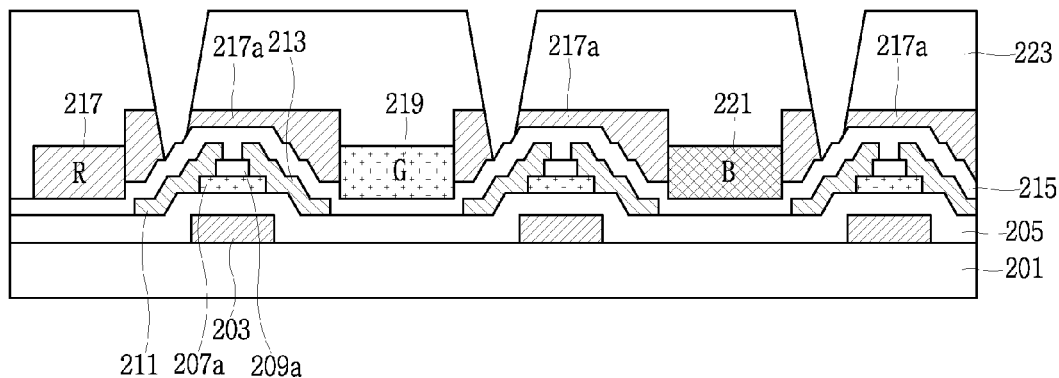

Thereafter, referring to FIG. 9H, an exposure process using a mask is performed, and thereafter, the organic insulating layer 223 and the underlying dummy color filter layer pattern 217a positioned in the non-pixel region NA are selectively removed through a developing process to define a drain electrode contact hole region. Here, the organic insulating layer 223 and the underlying dummy color filter layer pattern 217a do not have photosensitive material characteristics, so an exposure process may be performed thereon without using a material such as photoresist.

Figure 9I:
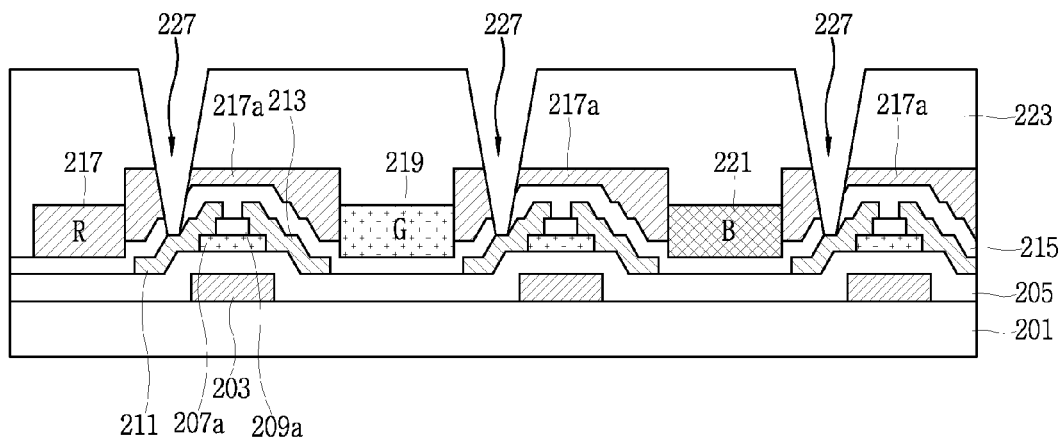

Subsequently, referring to FIG. 9I, the exposed passivation layer 215 positioned in the drain electrode contact hole region is selectively etched to form the drain electrode contact hole 227 exposing the drain electrode 213.

Figure 9J:
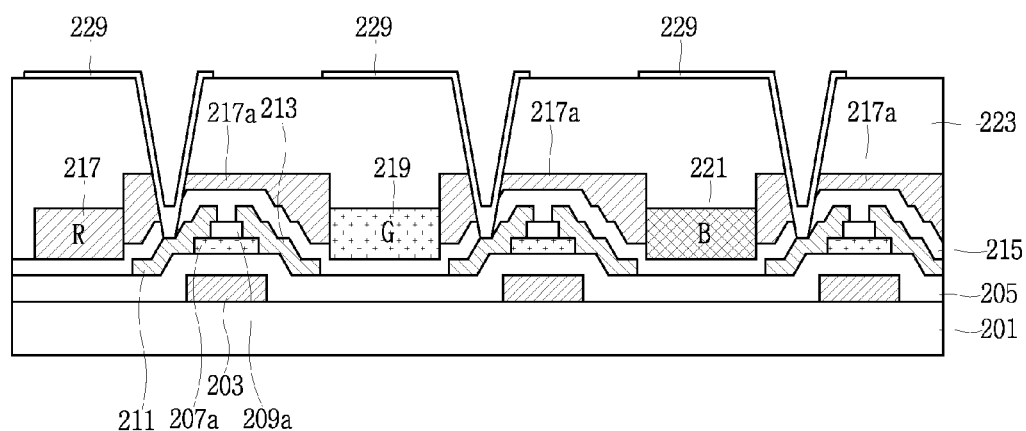

Thereafter, referring to FIG. 9J, a third conductive layer (not shown) is deposited on the organic insulating layer 223 including the drain electrode contact hole 227 and selectively etched through a masking processing using a photolithography process to form the first electrode 229 electrically connected to the drain electrode 213.

Figure 9K:
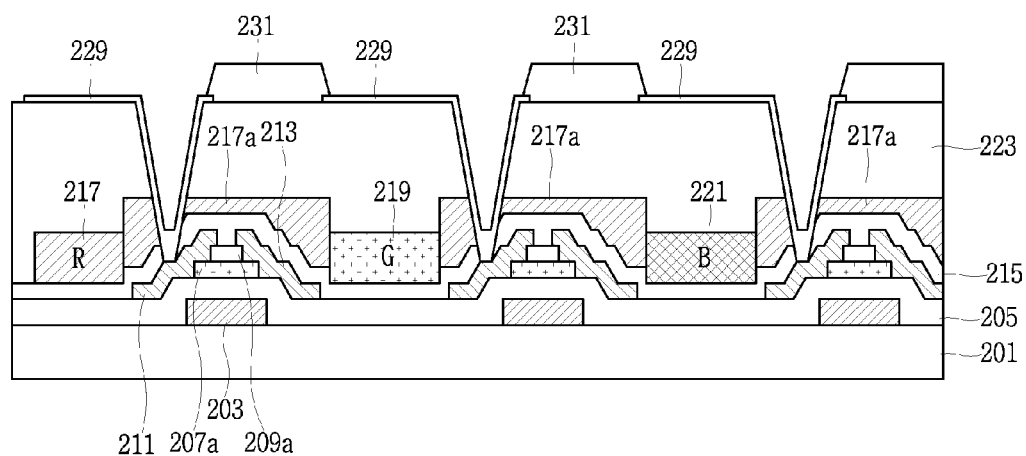

Subsequently, referring to FIG. 9K, an insulating layer (not shown) is deposited on the organic insulating layer 223 including the first electrode 229 and selectively etched through a masking processing using a photolithography process to form the bank layer 231. Here, the bank layer 231 is formed in the non-pixel region NA to serve to divide and insulate the divide the respective subpixels.

Figure 9L:
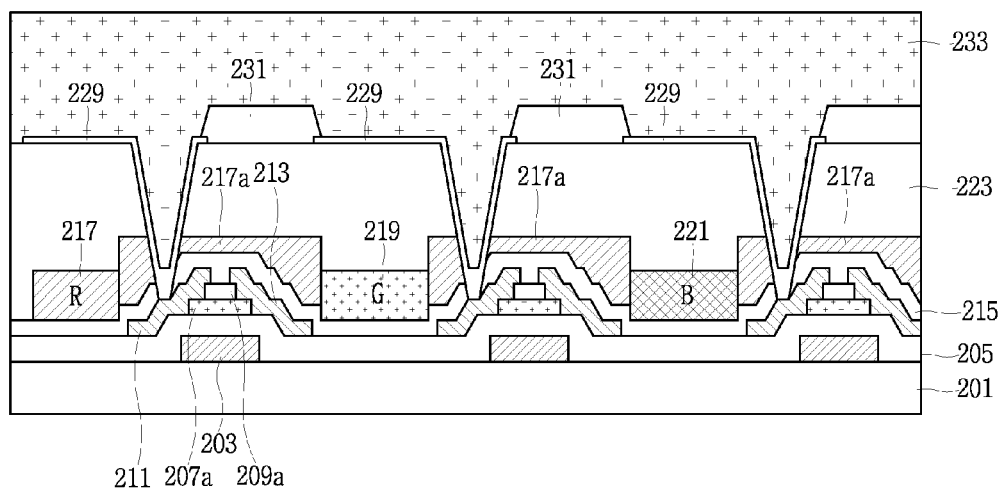

Thereafter, referring to FIG. 9L, the organic light emitting layer 233 is formed on the entire surface of the substrate including the bank layer 231. Here, the organic light emitting layer 233 may be formed as a single layer made of a light emitting material or may be formed as multiple layers including a hole injection layer, a hole transport layer, an emitting material layer, an electron transport layer, and an electron injection layer in order to enhance luminous efficiency.

Figure 9M:
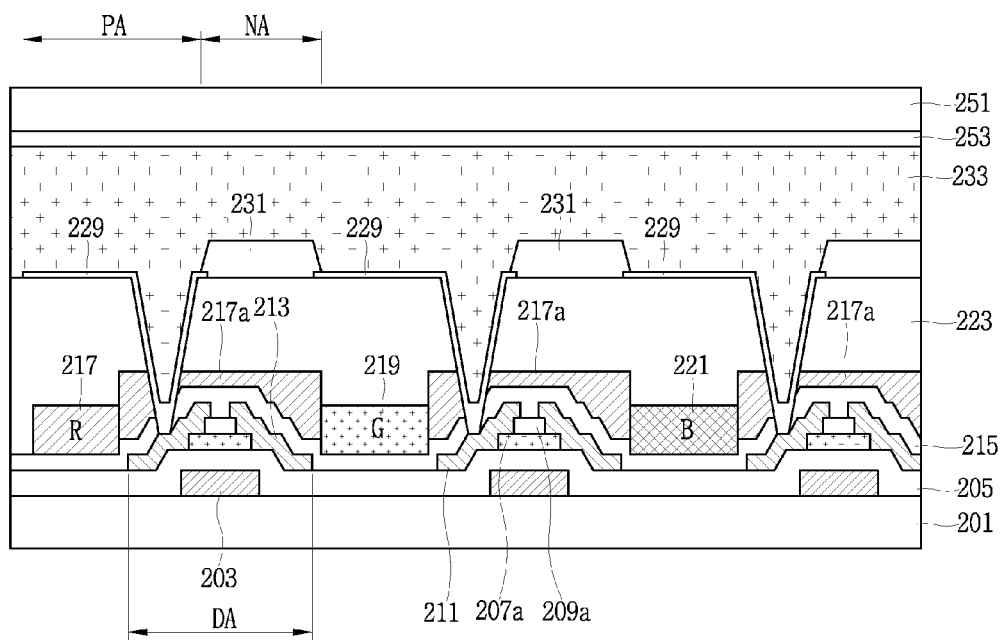

Subsequently, referring to FIG. 9M, the upper substrate 251 with the second electrode 253 formed thereon is attached to the organic light emitting layer 233, thus completing the fabrication process of the OLED display device according to another embodiment of the present invention.

In the OLED display device 200 fabricated thusly, when a predetermined voltage is applied to the first electrode 229 and the second electrode 253 according to a selected color signal, holes injected from the first electrode 229 and electrons applied from the second electrode 253 are transported to the organic light emitting layer 233 to form excitons. When the excitons transition from an excited state to a ground state, white light is generated, and as the white light passes through the R, G, B, and W color filter layers 217, 219, 221, and not shown, respectively, it is emitted in a full color form.

An LCD device having an oxide TFT according to another embodiment of the present invention will be described with reference to FIG. 10.

Figure 10:
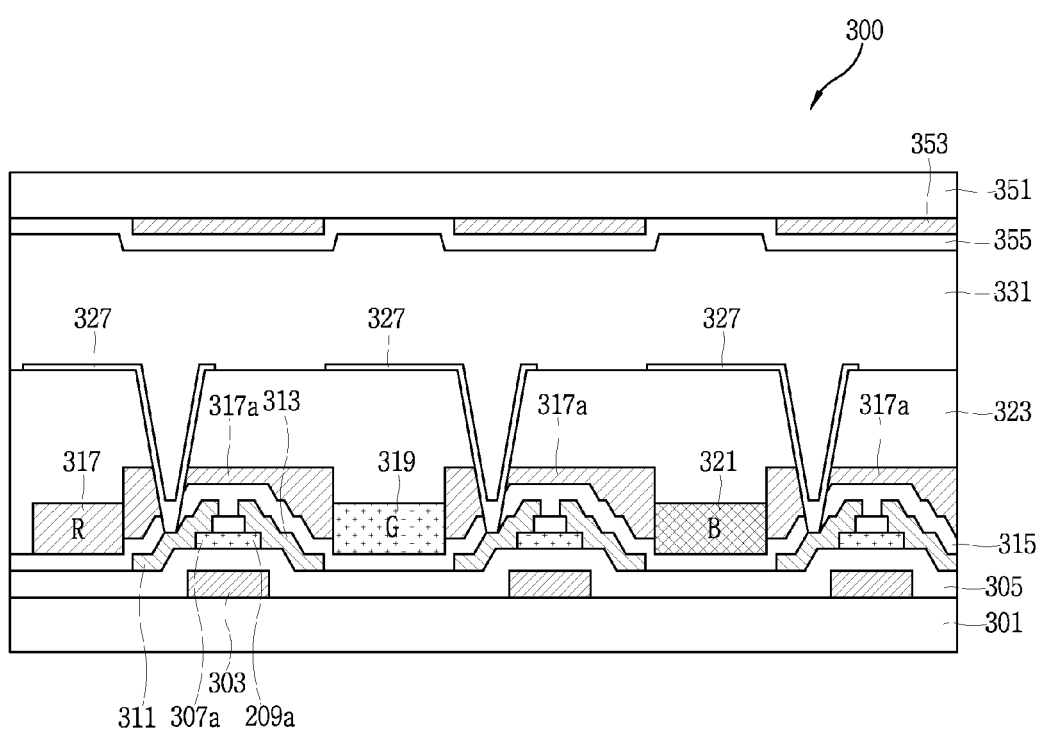
FIG. 10 is a schematic cross-sectional view of a liquid crystal display device including an oxide TFT according to another embodiment of the present invention.

FIG. 10 is a schematic cross-sectional view of a liquid crystal display device including an oxide TFT according to another embodiment of the present invention.

As illustrated in FIG. 10, a liquid crystal display device 300 including an oxide thin film transistor (TFT) according to another embodiment of the present invention includes: a lower substrate 301 and an upper substrate 351 on which a non-pixel region and a pixel region are defined, respectively; a TFT formed in the non-pixel region of the lower substrate 301 and including a gate electrode 303, a gate insulating layer 305 formed on the entire surface of the lower substrate 301 including the gate electrode 303, an active layer pattern 307a formed on the gate insulating layer 305 above the gate electrode 303 and completely overlapping the gate electrode 303, an etch stop layer pattern 309a formed on the active layer pattern 307a and the gate insulating layer 305, and a source electrode 311 and a drain electrode 313 formed on the gate insulating layer 305 including the etch stop layer pattern 309a and the active layer pattern 307a and spaced apart from one another, and overlapping both sides of the etch stop layer pattern 309a and the underlying active layer pattern 307a; a passivation layer 315 formed on the entire surface of the lower substrate including the TFT; a plurality of color filter layers 317, 319, and 321 formed on the passivation layer 315 of the pixel region of the lower substrate; a dummy color filter layer pattern 317a formed on the passivation layer 315 of the non-pixel region of the lower substrate; an organic insulating layer 323 formed on the entire surface of the lower substrate including the color filter layers 317, 319, and 321 and the dummy color filter layer pattern 317a; drain electrode contact holes (not shown) formed on the organic insulating layer 323, the dummy color filter layer pattern 317a, and the passivation layer 315, and exposing the drain electrode of the TFT; a pixel electrode 327 formed on the organic insulating layer 323 and electrically connected to the drain electrode 313 through the drain electrode contact hole; a black matrix 353 formed in the non-pixel region of the upper substrate and a common electrode 355 formed on the entire surface of the upper substrate including the black matrix; and a liquid crystal layer 331 formed between the lower substrate 301 and the upper substrate 331.

Here, although not shown, for example, the TFT (T) may be a bottom gate type TFT including a switching TFT and a driving TFT and made of an oxide semiconductor. The TFT (T) may also be formed as a top gate type TFT.

The gate electrode 303 of the TFT (T) may be made of silicon, glass, plastic, or any other appropriate material, or may be made of a metal or any other appropriate conductive material. For example, the gate electrode 203a may be made of any one selected from the group consisting of indium tin oxide (ITO), gallium zinc oxide (GZO), indium gallium zinc oxide (IGZO), indium gallium oxide (IGO), indium zinc oxide (IZO), indium zinc oxide (IZO), indium oxide (In2O3), a combination of two or more of them, or any other appropriate material(s). Also, a material used to form the gate electrode 203a may include any one selected from a conductive metal group consisting of aluminum (Al), tungsten (W), copper (Cu), molybdenum (Mo), chromium (Cr), titanium (Ti), molybdenum tungsten (MoW), molybdenum titanium (MoTi), copper/molybdenum titanium (Cu/MoTi), a combination of two or more of them, or any other appropriate material.

Also, the gate insulating layer 305 may be made of any one selected from the group consisting of silicon oxide (SiO2), silicon nitride (SiNx), zirconium oxide (ZrO2), hafnium oxide (HfO2), titanium oxide (TiO2), tantalum oxide (Ta2O5), a barium-strontium-titanium-oxygen compound (Ba—Sr—Ti—O), and a bismuth-zinc-niobium-oxygen compound (Bi—Zn—Nb—O), a combination of two or more of them, or any other appropriate material.

The active layer pattern 307a, a layer serving to form a channel allowing electrons to move therein between the source electrode 311 and the drain electrode 313, is made of an oxide semiconductor including silicon (Si) instead of a low temperature polysilicon (LTPS) or an amorphous silicon (a-Si) material.

In this case, the oxide semiconductor may be obtained by adding silicon (Si) to an oxide semiconductor including one or more selected from the group consisting of germanium (Ge), tin (Sn), lead (Pb), indium (In), titanium (Ti), gallium (Ga), and aluminum (Al), and zinc (Zn). For example, the active layer pattern 207a may be made of silicon indium zinc oxide (Si—InZnO (SIZO)) obtained by adding silicon ions to a composite indium zinc oxide (InZnO).

When the active layer pattern 307a is made of SIZO, a composition ratio of the content of silicon (Si) atoms to the entire content of zinc (Zn), indium (In), and silicon (Si) atoms in the active layer pattern may ranging from about 0.001 wt % to about 30 wt %. As the content of the silicon (Si) atoms is increased, the role of controlling generation of electrons of the active layer pattern is strengthened to potentially lower mobility, but element stability may be better.

Meanwhile, besides the foregoing materials, the active layer pattern 307a may further include a Group I element such as lithium (Li) or potassium (K), a Group II element such as magnesium (Mg), calcium (Ca), or strontium (Sr), a Group III element such as gallium (Ga), aluminum (Al), indium (In), or yttrium (Y), Group IV element such as titanium (Ti), zirconium (Zr), silicon (Si), tin (Sn), or geranium (Ge), a Group V element such as tantalum (Ta), vanadium (V), niobium (Nb), or antimony (Sb), or may further include lanthanides elements such as lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu).

Also, the etch stop layer pattern 309a may be made of any one selected from inorganic insulating materials including silicon oxide (SiO2) and silicon nitride (SiNx).

Also, the source electrode 311 and the drain electrode 313 are made of the same material as that of the gate electrode 203. The source electrode 311 and the drain electrode 313 may be made of a metal or any other conductive material, like the gate electrode 303a. For example, the source electrode 311 and the drain electrode 313 may be made of any one selected from the group consisting of indium tin oxide (ITO), gallium zinc oxide (GZO), indium gallium zinc oxide (IGZO), indium gallium oxide (IGO), indium zinc oxide (IZO), indium zinc oxide (IZO), indium oxide (In2O3), a combination of two or more of them, or any other appropriate material(s). Also, a material used to form the source portion 215a and the drain portion 215b may include any one selected from a conductive metal group consisting of aluminum (Al), tungsten (W), copper (Cu), molybdenum (Mo), chromium (Cr), titanium (Ti), molybdenum tungsten (MoW), molybdenum titanium (MoTi), copper/molybdenum titanium (Cu/MoTi), a combination of two or more of them, or any other appropriate material.

Here, a line width of the gate electrode 303 may be greater than that of the active layer pattern 307a, and the active layer pattern 307a completely overlaps the gate electrode 303.

Also, the etch stop layer pattern 309a overlaps the active layer pattern 307a and the gate electrode 303, and both sides thereof are formed to extend up to an external region of the active layer pattern 307a.

The source electrode 311 and the drain electrode 313 overlap both sides of the etch stop layer pattern 309a and underlying active layer pattern 307a and the gate electrode 303.

Thus, an upper portion of the active layer pattern 307a is completely covered by the etch stop layer pattern 309a, the source electrode 311, and the drain electrode 313, and a lower portion thereof is completely covered by the gate electrode 303.

In this manner, in order to block light directly made incident from a lower side of the substrate, a line width of the gate electrode 303 is formed to be larger than that of the active layer pattern 307a, and in order to prevent an additional degradation due to scattered-reflection of incident light, the active layer pattern 307a is completely covered by the etch stop layer pattern 309a, the source electrode 311, and the drain electrode 313, thereby preventing element reliability resulting from scattered-reflection of light.

Meanwhile, the R, G, B, and W color filter layers 317, 319, 321, and not shown, respectively) are formed by subpixels in the pixel region of the lower substrate 301.

The four subpixels including the R, G, B, and W color filter layers 317, 319, 321, and not shown, respectively, constitute a single pixel P.

Also, the TFT (T) including a switching TFT and a driving TFT is formed in the non-pixel region, i.e., in the driving region, of the lower substrate 301. A dummy color filter layer pattern 317a made of the same material as that of the R color filter layer 317 is formed at an upper portion of the TFT (T). Here, the dummy color filter layer pattern 317a may be made of the same material as that of the green (G) and blue (B) color filter layers, as well as the same material as that of the red color filter layer 317, and in this case, the dummy color filter layer pattern 317a may be formed as a single layer or may be formed by laminating the forgoing materials. Thus, since the dummy color filter layer pattern 317a is formed at an upper portion of the TFT (T), it absorbs light to prevent it from being scatter-reflected within the LCD device 300 and made incident to the interior of the TFT, thereby preventing a degradation of the TFT.

As described above, in the case of the oxide thin film transistor, the method for fabricating the TFT, the display device having the TFT, and the method for fabricating the display device, according to embodiments of the present invention, since the structure in which a line width of the gate electrode is larger than that of the active layer pattern in order to block light directly incident from a lower side of the substrate and the etch stop layer pattern, the source electrode, and the drain electrode fully cover the active layer pattern in order to prevent additional degradation due to scattered-reflection of incident light is employed, a degradation of element reliability due to scattered-reflection of light can be prevented.

Also, in the case of the oxide thin film transistor (TFT) a method for fabricating the TFT, a display device having the TFT, and a method for fabricating the display device according to embodiments of the present invention, since the dummy color filter layer pattern covers the TFT region as a non-pixel region in forming the color filter layer in the color filter on TFT (COT) structure, scattered-reflection of light and a threshold voltage Vth are lowered to improve element reliability.

Thus, in the array substrate for an LCD having an oxide TFT and the method for fabricating the same according to embodiments of the present invention, since the active layer pattern is made of an oxide semiconductor including silicon, it has high electron mobility and a production unit cost is lowered. Also, since the process of fabricating the active layer pattern can be performed at room temperature, the process can be facilitated.

The oxide TFT according to an embodiment of the present invention may be applied to fabricate an oxide TFT device that may replace an existing amorphous silicon TFT (a-Si TFT) or a polycrystalline silicon TFT (poly-Si TFT).

Also, the oxide TFT according to an embodiment of the present invention may be applied to a flat panel display, in particular, to an LCD or an OLED that requires a switching and driving element based on the TFT.

Finally, the oxide TFT according to an embodiment of the present invention may be applied to a flat panel display product, a cellular phone, a mobile device, a notebook computer, a monitor, a TV product, or the like, employing an LCD or an OLED.

Various matters have been specifically described but they should be construed as examples of preferred embodiments, rather than limiting the scope of the present invention. For example, a person skilled in the art to which the present invention pertains may diversity the components of the TFT according to the present invention and also modify a structure thereof.

Also, the TFT according to the present invention may also be applicable to a memory device or a logical device, as well as to an LCD or an OLED, and therefore, all changes and modifications that fall within the metes and bounds of the claims, or equivalents of such metes and bounds are therefore intended to be embraced by the appended claims.

What is claimed is:

1. An organic light emitting diode display device comprising:
   a lower substrate on which a non-pixel region and a light emitting region are defined;
   a thin film transistor (TFT) formed in the non-pixel region of the lower substrate and including
      a gate electrode,
      a gate insulating layer formed on the entire surface of the lower substrate including the gate electrode,
      an active layer pattern formed on the gate insulating layer above the gate electrode and completely overlapping the gate electrode, the active layer pattern formed of an oxide semiconductor,
      an etch stop layer pattern formed on the active layer pattern and the gate insulating layer,
      a source electrode and a drain electrode formed on the gate insulating layer including the etch stop layer pattern and the active layer pattern and spaced apart from one another, and overlapping both sides of the etch stop layer pattern and the underlying active layer pattern;
   a passivation layer formed on the entire surface of the lower substrate including the TFT;
   a plurality of color filter layers formed on the passivation layer of the light emitting region of the lower substrate;
   a dummy color filter layer pattern formed on the passivation layer of the non-pixel region of the lower substrate;
   an organic insulating layer formed on the entire surface of the lower substrate including the color filter layers and the dummy color filter layer pattern;
   drain electrode contact holes formed on the organic insulating layer, the dummy color filter layer pattern, and the passivation layer, and exposing the drain electrode of the TFT;
   a first electrode formed on the organic insulating layer and electrically connected to the drain electrode through the drain electrode contact hole;
   a bank layer formed on the organic insulating layer of the non-pixel region of the lower substrate;
   an organic light emitting layer formed on the entire surface of the lower substrate including the first electrode; and
   an upper substrate attached to an upper portion of the organic light emitting layer and having a second electrode formed thereon.

2. The organic light emitting diode display device of claim 1, wherein a line width of the gate electrode is greater than a line width of the active layer pattern.

3. The organic light emitting diode display device of claim 1, wherein an upper portion of the active layer pattern is completely covered by the etch stop layer pattern, the source electrode, and the drain electrode.

4. The organic light emitting diode display device of claim 1, wherein the dummy color filter layer pattern is made of the same color filter material as that of the color filter layer or has a structure in which different color filter materials are stacked or a single layer structure.

5. The organic light emitting diode display device of claim 1, wherein the oxide semiconductor comprises silicon indium zinc oxide (SIZO).

6. A method for fabricating an organic light emitting diode display device, the method comprising:
   providing a lower substrate on which a non-pixel region and a light emitting region are defined;
   forming a thin film transistor (TFT) in the non-pixel region of the lower substrate, the TFT including
      a gate electrode, a gate insulating layer formed on the entire surface of the lower substrate including the gate electrode, an active layer pattern formed on the gate insulating layer above the gate electrode and completely overlapping the gate electrode, the active layer pattern formed of an oxide semiconductor, an etch stop layer pattern formed on the active layer pattern and the gate insulating layer, a source electrode and a drain electrode formed on the gate insulating layer including the etch stop layer pattern and the active layer pattern and spaced apart from one another, and overlapping both sides of the etch stop layer pattern and the underlying active layer pattern;

forming a passivation layer on the entire surface of the lower substrate including the TFT;

forming a plurality of color filter layers on the passivation layer of the light emitting region of the lower substrate and forming a dummy color filter layer pattern on the passivation layer of the non-pixel region of the lower substrate;

forming an organic insulating layer on the entire surface of the lower substrate including the color filter layers and the dummy color filter layer pattern;

forming drain electrode contact holes, exposing the drain electrode of the TFT, on the organic insulating layer, the dummy color filter layer pattern, and the passivation layer;

forming a first electrode electrically connected to the drain electrode through the drain electrode contact hole, on the organic insulating layer;

forming a bank layer on the organic insulating layer of the non-pixel region of the lower substrate;

forming an organic light emitting layer on the entire surface of the lower substrate including the first electrode; and attaching an upper substrate with a second electrode formed thereon to an upper portion of the organic light emitting layer.

7. The method of claim 6, wherein a line width of the gate electrode is greater than a line width of the active layer pattern.

8. The method of claim 6, wherein an upper portion of the active layer pattern is completely covered by the etch stop layer pattern, the source electrode, and the drain electrode.

9. The method of claim 6, wherein the dummy color filter layer pattern is made of the same color filter material as that of the color filter layer or has a structure in which different color filter materials are stacked or a single layer structure.

10. The organic light emitting diode display device of claim 5, wherein when the oxide semiconductor is SIZO, a composition ratio of the content of silicon (Si) atoms to the entire content of zinc (Zn), indium (In), and silicon (Si) atoms in the active layer pattern has a range from 0.001% wt to 30% wt.

* * * * *